US009245895B2

(12) United States Patent
Cheng et al.

(10) Patent No.: US 9,245,895 B2
(45) Date of Patent: Jan. 26, 2016

(54) ORO AND ORPRO WITH BIT LINE TRENCH TO SUPPRESS TRANSPORT PROGRAM DISTURB

(75) Inventors: Ning Cheng, San Jose, CA (US); Kuo-Tung Chang, Saratoga, CA (US); Hiro Kinoshita, San Jose, CA (US); Chih-Yuh Yang, San Jose, CA (US); Lei Xue, San Jose, CA (US); Chungho Lee, Sunnyvale, CA (US); Minghao Shen, Sunnyvale, CA (US); Angela Hui, Fremont, CA (US); Huaqiang Wu, Mountain View, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 13/190,565

(22) Filed: Jul. 26, 2011

(65) Prior Publication Data
US 2011/0278660 A1 Nov. 17, 2011

Related U.S. Application Data

(62) Division of application No. 11/835,542, filed on Aug. 8, 2007, now Pat. No. 8,012,830.

(51) Int. Cl.
*H01L 29/788* (2006.01)
*H01L 27/115* (2006.01)
*H01L 21/28* (2006.01)
(Continued)

(52) U.S. Cl.
CPC ........ *H01L 27/115* (2013.01); *H01L 21/28273* (2013.01); *H01L 21/28282* (2013.01); *H01L 27/11521* (2013.01); *H01L 27/11568* (2013.01); *H01L 29/42332* (2013.01); *H01L 29/42348* (2013.01); *H01L 29/66825* (2013.01);
(Continued)

(58) Field of Classification Search
CPC .............. H01L 21/28273; H01L 21/28282; H01L 27/11521; H01L 27/11568; H01L 29/42332; H01L 29/42348; H01L 29/66825; H01L 29/66833; H01L 29/7887; H01L 29/7923
USPC ........... 257/314–316, 321, 324–326; 438/262
See application file for complete search history.

(56) References Cited

U.S. PATENT DOCUMENTS 3,717,514 A * 2/1973 Burgess ........................ 438/356
5,278,438 A  1/1994 Kim et al.
(Continued)

FOREIGN PATENT DOCUMENTS

WO  0217389  2/2002

OTHER PUBLICATIONS

International Search Report for International Application No. PCT/US2008/071544 mailed on Nov. 13, 2008.
(Continued)

*Primary Examiner* — Bryan Junge

(57) ABSTRACT

Memory devices having improved TPD characteristics and methods of making the memory devices are provided. The memory devices contain two or more memory cells on a semiconductor substrate and bit line openings containing a bit line dielectric between the memory cells. The memory cell contains a charge storage layer and a first poly gate. The bit line opening extends into the semiconductor substrate. By containing the bit line dielectric in the bit line openings that extend into the semiconductor substrate, the memory device can improve the electrical isolation between memory cells, thereby preventing and/or mitigating TPD.

14 Claims, 14 Drawing Sheets

(51) Int. Cl.
*H01L 29/423* (2006.01)
*H01L 29/66* (2006.01)
*H01L 29/792* (2006.01)

(52) U.S. Cl.
CPC ...... *H01L29/66833* (2013.01); *H01L 29/7887* (2013.01); *H01L 29/7923* (2013.01)

(56) References Cited

U.S. PATENT DOCUMENTS

| | | | |
|---|---|---|---|
| 6,140,171 A | 10/2000 | Allen et al. | |
| 6,248,633 B1 | 6/2001 | Ogura et al. | |
| 6,326,268 B1 | 12/2001 | Park et al. | |
| 6,406,960 B1 | 6/2002 | Hopper et al. | |
| 6,436,800 B1 | 8/2002 | Kuo et al. | |
| 6,756,631 B2* | 6/2004 | Wu | 257/316 |
| 6,838,344 B2 | 1/2005 | Satoh et al. | |
| 6,849,514 B2* | 2/2005 | Han | 438/262 |
| 6,936,884 B2 | 8/2005 | Chae et al. | |
| 6,942,750 B2 | 9/2005 | Chou et al. | |
| 6,989,320 B2 | 1/2006 | Qian et al. | |
| 7,125,763 B1 | 10/2006 | Sobek et al. | |
| 7,253,055 B2 | 8/2007 | Mokhlesi et al. | |
| 7,279,384 B2 | 10/2007 | Milda | |
| 7,288,813 B2 | 10/2007 | Tsunoda et al. | |
| 7,476,621 B1 | 1/2009 | Nguyen et al. | |
| 7,638,835 B2* | 12/2009 | Irani et al. | 257/324 |
| 2003/0124803 A1 | 7/2003 | Ueda et al. | |
| 2004/0245564 A1 | 12/2004 | Ogura et al. | |
| 2006/0001075 A1* | 1/2006 | Shih | 257/315 |
| 2006/0214219 A1* | 9/2006 | Choi et al. | 257/315 |
| 2006/0261418 A1* | 11/2006 | Eitan et al. | 257/390 |
| 2007/0048957 A1 | 3/2007 | Lee et al. | |
| 2007/0066003 A1 | 3/2007 | Hur et al. | |
| 2007/0145451 A1* | 6/2007 | Park | 257/302 |
| 2008/0149989 A1 | 6/2008 | Cheng et al. | |

OTHER PUBLICATIONS

Written Opinion of the International Searching Authority for International Application No. PCT/US2008/071544 mailed on Nov. 13, 2008.

U.S. Office Action for U.S. Appl. No. 11/835,542 mailed on Feb. 2, 2009.

U.S. Office Action for U.S. Appl. No. 11/835,542 mailed on Aug. 12, 2009.

U.S. Office Action for U.S. Appl. No. 11/835,542 mailed on Mar. 3, 2010.

U.S. Office Action for U.S. Appl. No. 11/835,542 mailed on Jul. 9, 2010.

USPTO Notice of Allowance for U.S. Appl. No. 11/835,542 dated May 3, 2011; 8 pages.

* cited by examiner

ORO AND ORPRO WITH BIT LINE TRENCH TO SUPPRESS TRANSPORT PROGRAM DISTURB

CROSS-REFERENCE TO RELATED APPLICATIONS

This application is a Division of application Ser. No. 11/835,542 filed Aug. 8, 2007, the entire contents of which is hereby incorporated by reference.

TECHNICAL FIELD

Described are memory devices having improved transport program disturb (TPD) characteristics and methods of forming the memory devices.

BACKGROUND

Modern computing devices utilize a variety of kinds of memory devices to store and access information. Memory devices include the general classes of random access memories (RAM) and read only memories (ROM). These classes further contain static RAM (SRAM), dynamic RAM (DRAM), programmable ROM (PROM), electrically programmable ROM (EPROM), electrically erasable PROM (EEPROM), as well as FLASH memory, and the like. Most memory devices employ an internal architecture in the form of an array memory of bit cells, containing plural rows and plural intersecting columns.

A memory cell is placed at each intersecting row and column in the array. Typically, a particular memory cell is accessed by activating its row and then reading or writing the state of its column. Memory sizes are defined by the row and column architecture. For example, a 1024 row by 1024 column memory array defines a memory device having one megabit of memory cells. The array rows are referred to as word lines and the array columns are referred to as bit lines.

The trend in semiconductor memory devices has been toward higher circuit density with higher numbers of bit cells per device, lower operating voltages, and higher access speeds. To achieve these high densities there have been, and continue to be, efforts toward scaling down device dimensions (e.g., at sub-micron levels). However, as scaling down device dimensions, hot electrons generated during programming a memory cell may reach adjacent memory cells and disturb programming the adjacent memory cells (e.g., TPD). Thus, the requirement of small features with close spacing between adjacent features requires sophisticated manufacturing techniques.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the subject invention provides memory devices having improved TPD characteristics. The memory devices contain two or more memory cells on a semiconductor substrate and bit line openings between the memory cells. The memory cells contain a charge storage layer and a first poly gate. The bit line openings extend into the semiconductor substrate and contain a bit line dielectric. By containing the bit line dielectric in the bit line openings that extend into the semiconductor substrate, the memory device can improve the electrical isolation between memory cells, thereby preventing and/or mitigating TPD.

Another aspect of the subject invention provides methods of making memory devices having improved TPD characteristics. The methods include providing features and first openings therebetween on a semiconductor substrate; forming bit line openings by forming bit line trenches in the semiconductor substrate between the features; forming pocket implant regions in the semiconductor substrate adjacent the features; and forming first bit lines in the semiconductor substrate under the bit line openings.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
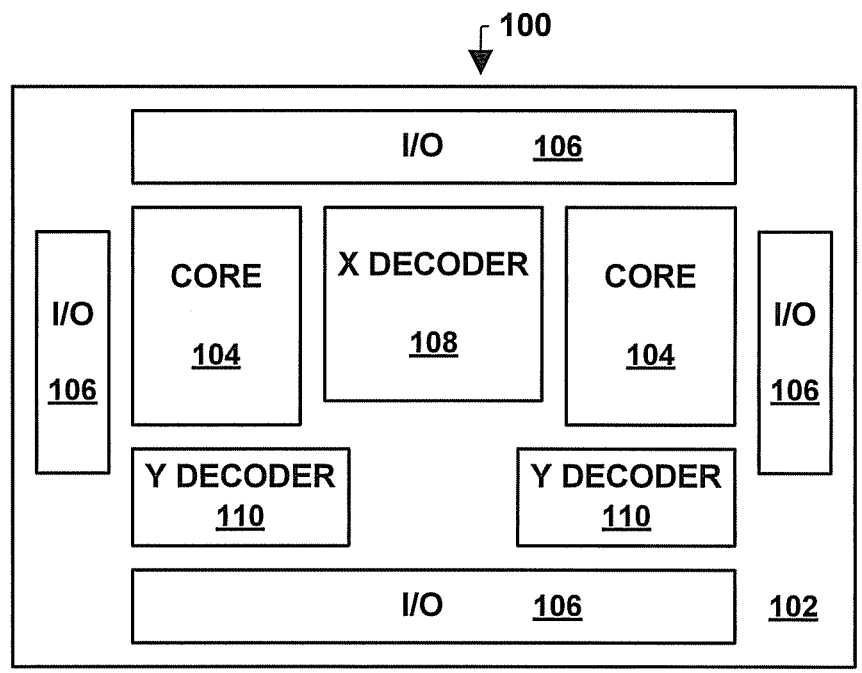
FIG. 1 is a top view of an exemplary memory device in accordance with a first aspect of the subject invention.

A memory cell, for example, a single bit memory cell or a dual bit memory cell, is programmed by applying a relatively high voltage to a control gate and connecting a source to ground and a drain to a predetermined potential above the source. During the programming of memory cells, hot electrons in a core cell channel region tunnel through a gate oxide into the floating gate and become trapped in the floating gate since the floating gate is surrounded by an interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

The hot electrons generated during programming may be so hot that they go under bitline junction. The hot electrons may reach floating gates or storage elements of adjacent memory cells. Moreover, hot holes generated during programming may have a secondary impact ionization below a bit line region and the secondary electrons diffuse to a gate of adjacent memory cell where they are accelerated by a drain depletion region and injected into a storage element of the adjacent memory cell. As a result, due to the hot electrons and hot hoes generated during programming, memory cells may suffer from a TPD phenomenon.

The subject invention provides memory devices having improved TPD characteristics and methods of forming the memory devices. In the memory device, the memory cells are separated from each other by bit line openings on a semiconductor substrate. The bit line openings extend into the semiconductor substrate and contain a bit line dielectric. By containing the bit line dielectric in the bit line opening that extends into the semiconductor substrate, the memory device can improve the electrical isolation between the memory cells, thereby preventing and/or mitigating TPD.

The TPD solutions described herein can be applied to any suitable type of memory cell. For example, the TPD solutions described herein can be applied to single-level memory cells, multi-level memory cells, single bit memory cells, dual bit memory cells, quad bit memory cells, and the like. The dual bit memory is a relatively modern memory technology and allows multiple bits to be stored in a single memory cell. The dual bit memory cell is essentially split into two identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit storage of two bits.

A dual bit memory cell can have a semiconductor substrate with implanted conductive bit lines. The dual bit memory cell contains a charge storage layer that can contain one or more layers and can be formed over the semiconductor substrate. For example, the charge storage layer can contain three separate layers: a first insulating layer, a charge storage layer, and a second insulating layer. Word lines are formed over the charge storage layer substantially perpendicular to the bit lines. Programming circuitry controls two bits per cell by applying a signal to the word line, which acts as a control gate, and changing bit line connections such that one bit is stored by source and drain being connected in one arrangement and a complementary bit is stored by the source and drain being interchanged in another arrangement.

The innovation is now described with reference to the drawings, wherein like reference numerals are used to refer to like elements throughout. In the following description, for purposes of explanation, numerous specific details are set forth in order to provide a thorough understanding of the subject invention. It may be evident, however, that the invention can be practiced without these specific details. In other instances, well-known structures and devices are shown in block diagram form in order to facilitate describing the invention.

Although the TPD solutions can be applied to any type of memory cell, the innovation is hereinafter illustrated and described in the context of an exemplary semiconductor device having one or more memory arrays containing dual bit memory cells arranged in a virtual ground type array architecture. FIG. 1 illustrates a top view of an exemplary dual bit flash memory device 100. The memory device 100 generally includes a semiconductor substrate 102 in which one or more high-density core regions 104 and one or more lower-density peripheral portions are formed. The high-density core regions 104 typically include one or more M by N arrays of individually addressable, substantially identical dual bit memory cells. The lower-density peripheral portions on the other hand typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
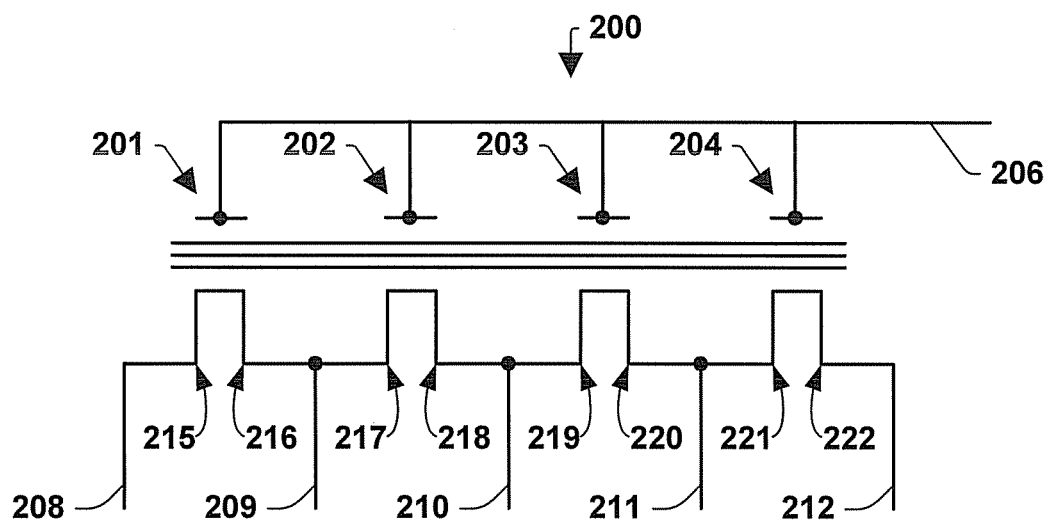
FIG. 2 is a schematic illustration of a portion of a memory core such as may include at least part of one of the cores depicted in FIG. 1 in a virtual ground type configuration in accordance with a first aspect of the subject invention.

FIG. 2 is a schematic illustration of a portion 200 of an exemplary memory core such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a word line 206, which serves as a control gate, and pairs of the memory cells share a common bit line. For instance, in the example shown, the memory cell 201 associates bit lines 208 and 209; the memory cell 202 associates bit lines 209 and 210; the memory cell 203 associates bit lines 210 and 211; and the memory cell 204 associates bit lines 211 and 212. As such, cells 201 and 202 share bit line 209, cells 202 and 203 share bit line 210 and cells 203 and 204 share bit line 211, respectively.

Depending upon a signal on the word line and the connection of the bit lines in a memory cell to an electrical source or drain, the memory cells 201 through 204 are capable of writing, reading, and erasing bits at locations 215 through 222. For example, control of the bit at location 215 is achieved through connection of the drain to the bit line 208 and the source to the bit line 209. Similarly, control of the bit at location 216 is achieved through connection of the drain to the bit line 209 and the source to the bit line 208. It will be appreciated that although adjacent memory cells share common bit lines, the adjacent memory cells do not interfere with each other because the memory cells are typically programmed one at a time and in such instances only one memory cell is active at a time while programming.

Figure 3:
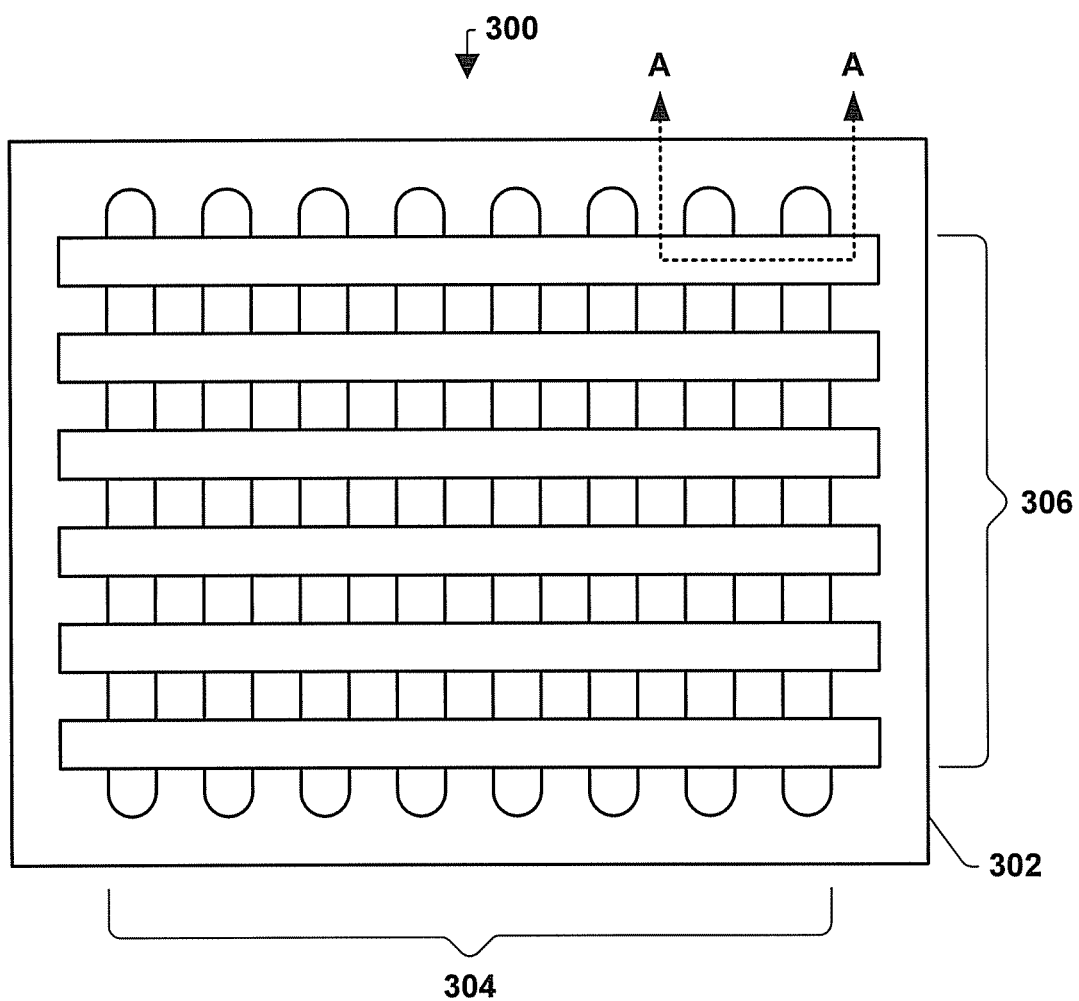
FIG. 3 is a top view of at least a portion of a memory core, such as may include at least part of one of the cores depicted in FIG. 1 in accordance with a first aspect of the subject invention.

FIG. 3 illustrates a top view of at least a portion 300 of a memory core, such as may include at least part of one of the M by N array cores 104 depicted in FIG. 1. The memory 300 is formed upon a semiconductor substrate 302 and has a plurality of implanted bit lines 304 extending substantially parallel to one another, and further includes a plurality of formed word lines 306 extending substantially in parallel to one another and at substantially right angles to the plurality of implanted bit lines 304. It will be appreciated that the word lines 306 and bit lines 304 have contacts and interconnections (not shown) to programming circuitry such as may be represented, at least in part, by x-decoders and y-decoders.

Figure 4:
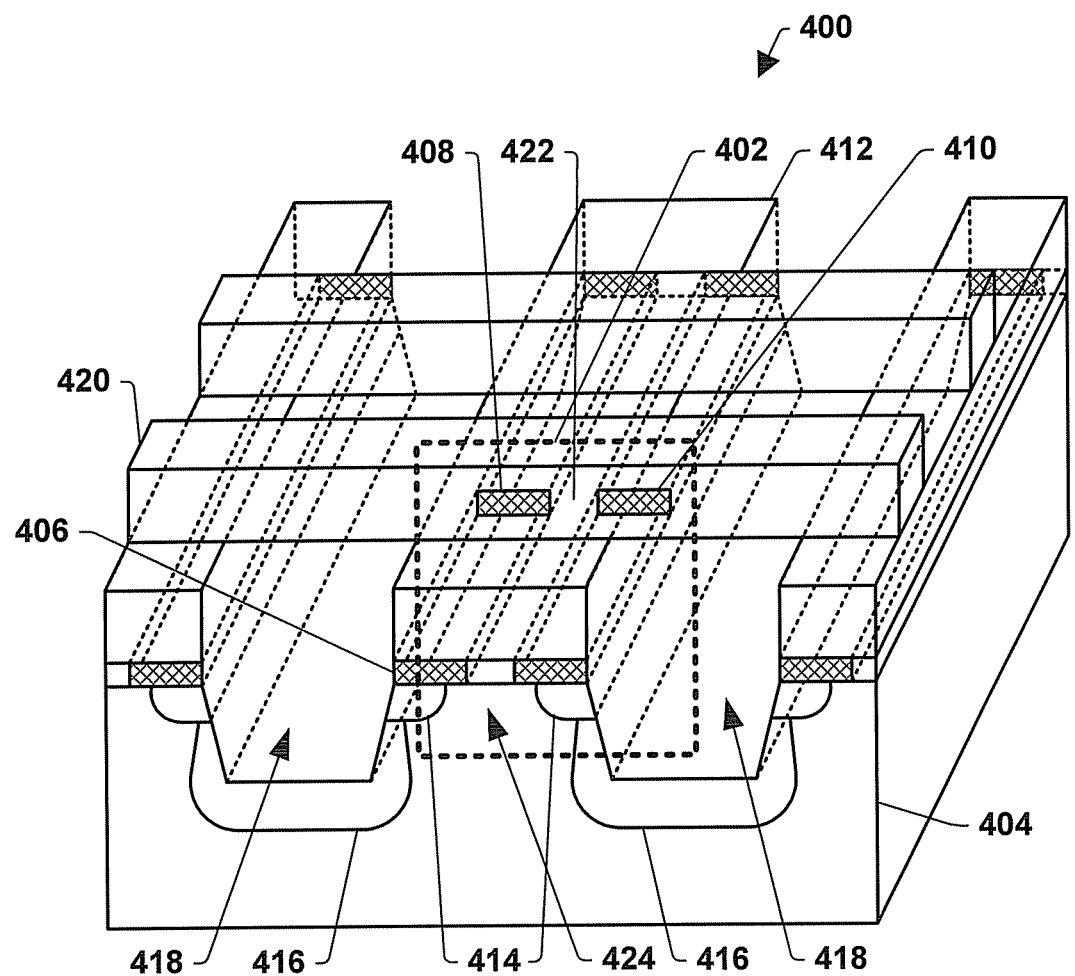
FIG. 4 is a cross-sectional isometric illustration of exemplary memory cells, such as that taken along line A-A of FIG. 3 in accordance with a first aspect of the subject invention.

FIG. 4 is a cross-sectional isometric illustration of a portion of a memory device 400 containing a dual bit memory cell 402 as indicated by a dashed line, such as that taken along line A-A of FIG. 3. The dual bit memory cell 402 is formed on a semiconductor substrate 404. The memory cell 402 contains a charge storage layer 406 containing two charge storage nodes 408, 410 on the semiconductor substrate 404; a first poly gate 412 on the charge storage layer 406; pocket implant regions 414 adjacent or under the charge storage layer 406 in the semiconductor substrate 404; a first bit line 416 adjacent the charge storage layer 406 and under a bit line opening 418 in the semiconductor substrate 404; and a word line 420. In one embodiment, the two charge storage nodes 408, 410 are physically separated by a central dielectric 422 in the charge storage layer 406. In another embodiment, the two charge storage nodes are not physically separated in a single charge storage layer (not shown).

Since the memory cell 402 has the two charge storage nodes 408, 410, the memory cell 402 can store two physically distinct bits. Each bit within the memory cell 402 serves as a binary unit of data (e.g., either 1 or 0) that can be mapped directly to a memory array. Reading or programming one side of charge storage nodes 408, 410 occurs independently of whatever data is stored on the opposite side of the charge storage nodes 408, 410.

The memory cell 402 is separated from adjacent memory cells by bit line openings 418. The bit line opening 418 extends into the semiconductor substrate 404 (e.g., bit line trench). The bit line opening 418 can contain a bit line dielectric such as oxides (e.g., silicon oxide, high temperature oxide (HTO), HDP oxide).

Two conductive bit lines 416 are depicted in FIG. 4 underlying the charge storage layer 406. It will be appreciated that any number of such bit lines can be implanted into the semiconductor substrate 404, and that such bit lines may correspond to the bit lines 306 depicted in FIG. 3. The bit lines 416 typically contain an implanted n-type material, such as arsenic, and may include an oxide portion (not shown) in some examples. The two conductive bit lines 416 are spaced apart and define a channel region 424 therebetween. The pocket implant regions 414 typically contain an implanted p-type material, such as boron. The pocket implant regions can facilitate controlling a threshold voltage of the memory cell 402.

Two conductive word lines 420 are similarly depicted overlying the charge storage layer 406. It will be appreciated that any number of such word lines can be formed over the charge storage layer 406, and that such word lines may correspond to the word lines 304 depicted in FIG. 3. The word lines 420 can contain a polysilicon material, for example, where the polysilicon material may be deposited over the charge storage layer 406 and then patterned and etched.

Locations 408 and 410 indicate generally where respective bits of data can be stored in a memory cell 402. It will be appreciated that the channel 424 has an effective length and that the bits will be brought closer together as this length is reduced (e.g., as a result of scaling).

Figure 5:
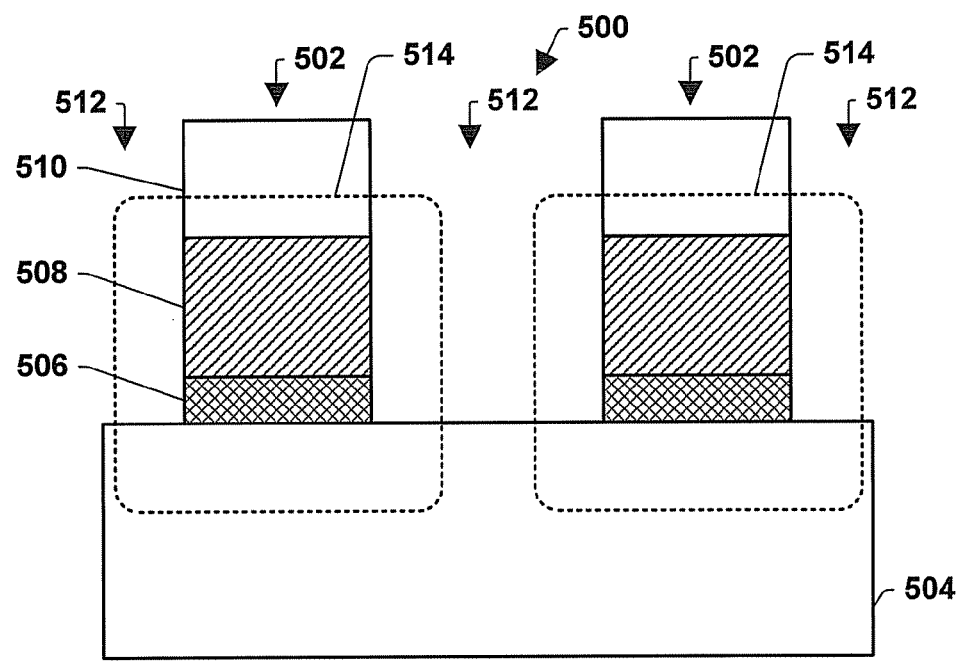
FIGS. 5-7 illustrate an exemplary method for making features and first openings therebetween on a semiconductor substrate.

Referring to FIGS. 5 to 12, FIGS. 13 to 17, and FIGS. 18 to 24, three of many possible exemplary embodiments of forming a memory device are specifically illustrated. FIG. 5 illustrates a cross sectional view of an intermediate state of a portion of an exemplary memory device 500. The memory device 500 can contain one or more features 502 on a semiconductor substrate 504. The features 502 can contain a dielectric layer 506, a first poly layer 508, and a first mask layer 510. The memory device 500 has first openings 512 between the features 502. A memory cell is formed in the subsequent processes at a position indicated by a dashed line 514.

For simplicity of illustration in FIG. 5, two features 502 and three first openings 512 are shown. However, the memory device 500 can have any suitable number of features and first openings. For example, the memory device 500 can have a M×N array of features 502 with M rows and N columns.

The semiconductor substrate 504 may contain any suitable semiconductor material on which electric devices such as memory cell transistors can be formed. Examples of semiconductor materials include silicon, gallium arsenide, indium phosphide, and the like. The first poly layer 508 typically contains polysilicon.

The dielectric layer 506 can contain any suitable dielectric material such as oxide materials. Examples of oxides include silicon oxide, HTO, and the like. In another embodiment, the dielectric layer 506 contains an oxide that is formed using a Slot Plane Antenna (SPA) process. In yet another embodiment, the dielectric layer 506 contains an oxide that is formed using an in-site steam generation (ISSG) process.

The first mask layer 510 may contain any suitable mask material. Examples of mask materials include oxides such as silicon oxide ($Si_xO_y$) and silicon-dioxide ($SiO_2$); nitrides such as silicon nitride ($Si_xN_y$), silicon rich nitride, and oxygen rich silicon nitride; and the like.

Although not shown, an anti-reflective coating (ARC) can be formed on the first mask layer 510 for increasing resolution of a subsequent lithography process. Any suitable ARC material can be employed. For example, ARC contains oxides such as silicon oxide ($Si_xO_y$) and silicon-dioxide ($SiO_2$); nitrides such as silicon nitride ($Si_xN_y$), silicon rich nitride, and oxygen rich silicon nitride; carbides such as silicon carbide ($Si_xC_y$); amorphous carbon; and the like.

The features 502 can be formed on the semiconductor substrate by any suitable technique. For example, a dielectric layer is formed on a semiconductor substrate, a first poly layer is formed on the dielectric layer, and a first mask layer is formed on the first poly layer. The first mask layer is patterned by removing portions of the first mask layer via, for example, lithography and etching techniques, thereby forming a patterned first mask layer 510 and exposing portions of the first poly layer and the dielectric layer. The first poly layer and the dielectric layer are patterned by removing the exposed portions of the first poly layer and the dielectric layer that are not covered with the patterned first mask layer, thereby forming the patterned first poly layer 508 and the patterned dielectric layer 506.

Figure 6:
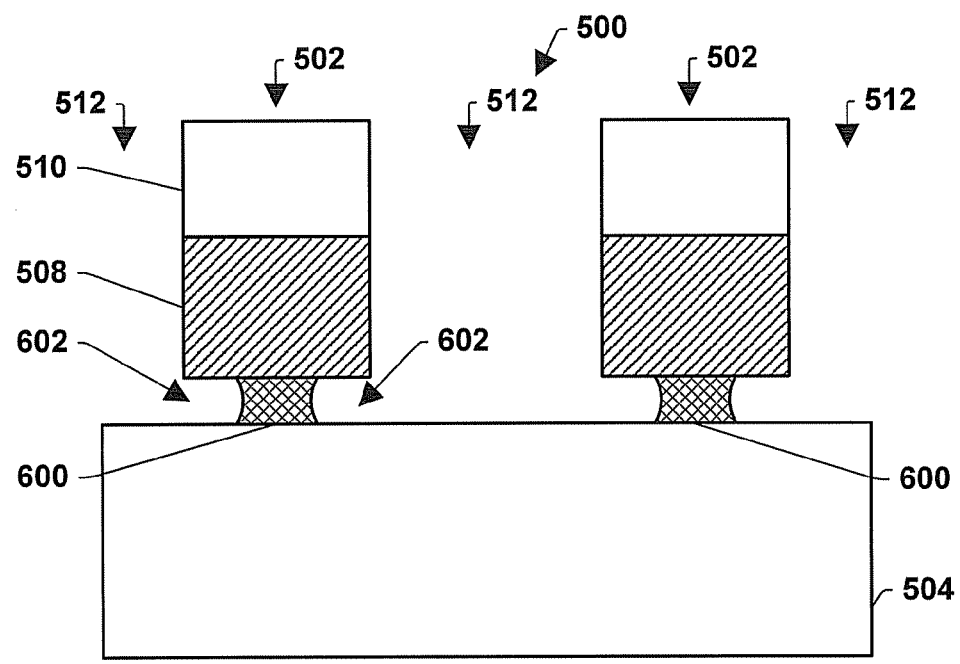

FIG. 6 illustrates forming an undercut portion 600 of the dielectric layer 506 and openings 602 between the semiconductor substrate 504 and the first poly layer 508 by undercutting the dielectric layer 506 via, for example, etching. Portions of the dielectric layer 506 are removed, thereby forming the undercut portion 600 of the dielectric layer 506 and the openings 602 between the semiconductor substrate 504 and the first poly layer 508. Charge storage nodes are formed in the openings 602 in subsequent processes, and the undercut portion 600 of the dielectric layer 506 becomes a center dielectric between the charge storage nodes.

Portions of the dielectric layer 506 are removed by any suitable etchant. When the dielectric layer 506 contains oxide materials, portions of the dielectric layer 506 can be removed by contacting the dielectric layer 506 with any suitable oxide etchant that does not substantially affect or damage the integrity of other layers in the memory device 500 such as the first poly layer 508. Examples of oxide etchants include halogen acids such as hydrofluoric acid. In one embodiment, the oxide etchant is a hydrofluoric acid solution such as a buffered hydrofluoric acid (BHF: e.g., hydrofluoric acid-ammonium fluoride buffered solution). In another embodiment, the oxide etchant is a vapor of hydrofluoric acid. Other oxide etchants can also be used as long as they are capable of removing portions of the dielectric layer 506 selective to other layers such as the first poly layer 508.

Figure 7:
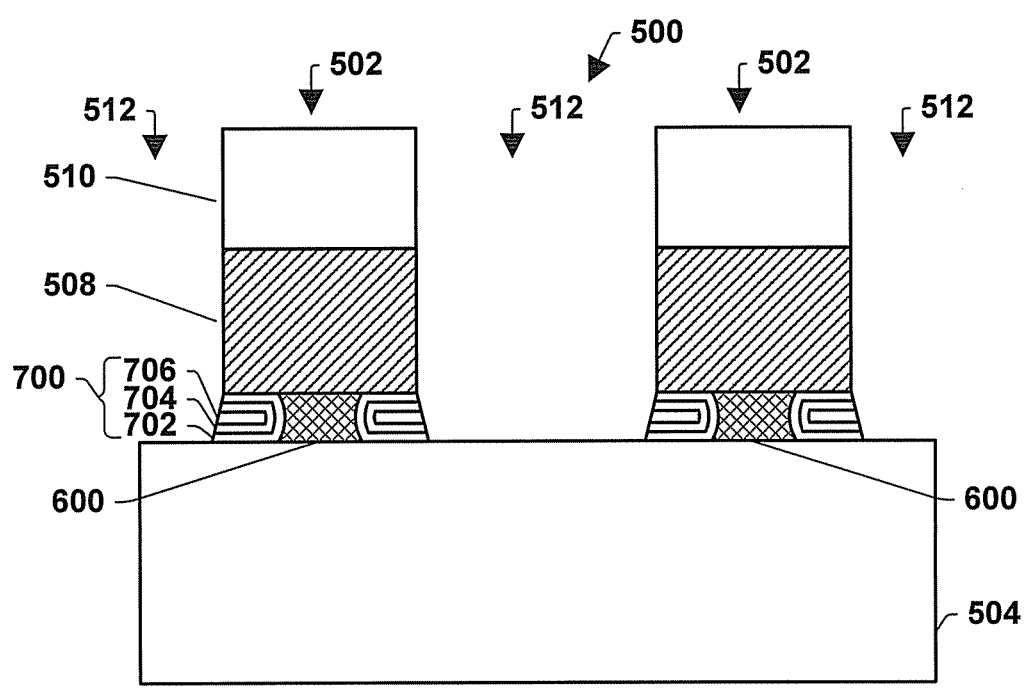

FIG. 7 illustrates forming charge storage nodes 700 in the openings 602 between the semiconductor substrate 504 and the first poly layer 508. The charge storage nodes 700 and the undercut dielectric portion 600 may be referred to as a charge storage layer. The configuration and/or constituent of the charge storage node 700 may vary and are not critical to the subject invention. The charge storage node 700 generally can contain any suitable charge storage dielectric material. Examples of charge storage dielectric materials include nitrides (e.g., silicon nitride, silicon oxynitride, and silicon rich nitride), oxides, silicates, a high-k dielectric, for example, having a dielectric constant higher than that of silicon dioxide ($SiO_2$), and the like. In one embodiment, the charge storage dielectric material contains silicon nitride, silicon oxynitride, and/or silicon rich nitride. In another example, the charge storage material contains oxides or silicates containing Al, Ta, Hf, La, Zr, Ti, Nb, Cr, V, Y, Ce and/or Pr. The charge storage node 700 can be formed on the semiconductor substrate 504 by any suitable technique. For example, the charge storage node 700 can be formed by chemical vapor deposition (CVD), lithography, and etching techniques.

Specific examples of charge storage node 700 include an oxide/nitride/oxide tri-layer, an oxide/nitride bi-layer, a nitride/oxide bi-layer, an oxide/tantalum oxide bi-layer ($SiO_2/Ta_2O_5$), an oxide/tantalum oxide/oxide tri-layer ($SiO_2/Ta_2O_5/SiO_2$), an oxide/strontium titanate bi-layer ($SiO_2/SrTiO_3$), an oxide/barium strontium titanate bi-layer ($SiO_2/BaSrTiO_2$), an oxide/strontium titanate/oxide tri-layer ($SiO_2/SrTiO_3/SiO_2$), an oxide/strontium titanate/barium strontium titanate tri-layer ($SiO_2/SrTiO_3/BaSrTiO_2$), and the like.

In one embodiment, the charge storage node 700 can contain three separate layers: a first insulating layer, a charge storage dielectric layer, and a second insulating layer. The first and second insulating layers can contain an oxide dielectric such as silicon dioxide ($SiO_2$) and the charge storage dielectric layer can contain a nitride dielectric such as silicon nitride ($Si_xN_y$). The oxide-nitride-oxide configuration may be referred to as an ONO layer. Especially, when the nitride layer contains silicon rich nitride, the oxide-nitride-oxide configuration may be referred to as an ORO tri-layer. The oxide-nitride-oxide tri-layer can be fabricated by forming a first silicon oxide layer, forming a silicon nitride layer on the first silicon oxide layer, and forming a second silicon oxide layer on the silicon nitride layer.

In another embodiment, the charge storage node 700 can contain five separate layers, for example, oxide-nitride-polysilicon-nitride-oxide. The oxide-nitride-polysilicon-nitride-oxide configuration may be referred to as an ORPRO layer when the nitride layer contains silicon rich nitride.

By way of illustration, the charge storage nodes 700 of FIG. 7 contain an ORPRO layer containing a first oxide layer 702, a nitride layer 704, and a polysilicon layer 706. The ORPRO layer can be formed by any suitable technique. For example, a first oxide layer is formed on surfaces of the semiconductor substrate 504, the undercut dielectric portion 600, and the first poly layer 508 in the opening 602 by, for example, oxidation techniques (e.g., thermal oxidation, plasma-assisted oxidation, and the like) and/or deposition techniques (e.g., CVD, spin-on techniques, and the like). A nitride layer is formed on the first oxide layer by, for example, deposition techniques (e.g., CVD, spin-on techniques, and the like). A polysilicon layer is formed in an opening surrounded with the nitride layer 704 in the first opening 602 by, for example, deposition techniques (e.g., CVD, spin-on techniques, and the like). Then, portions of the first oxide layer, the nitride layer, and the polysilicon layer that are not covered with the first poly layer 508 are removed by, for example, etching. In one embodiment, the charge storage nodes 700 have relatively a sloping side surface that extend perpendicular to the topological surface of the semiconductor substrate 504. In another embodiment, the charge storage nodes 700 have a relatively vertical side surface (not shown).

While FIGS. 5-7 illustrate the exemplary method of forming the features on a semiconductor substrate, the details of the structure and manufacture of the features are not critical to the present invention. The details of the structure and manufacture of the features can be found in, for example, commonly-assigned U.S. Pat. No. 7,157,335, issued Jan. 2, 2007, which is hereby incorporated by reference. For example, in one embodiment, the feature 502 contain a charge storage layer such as an ORO layer, an ORPRO layer, and the like, but does not contain a center dielectric 600 (not shown). In another example, after forming charge storage nodes, a center dielectric 600 is formed by removing portions of a charge storage layer via, for example, etching, and then depositing a center dielectric material in the removed portion.

Figure 8:
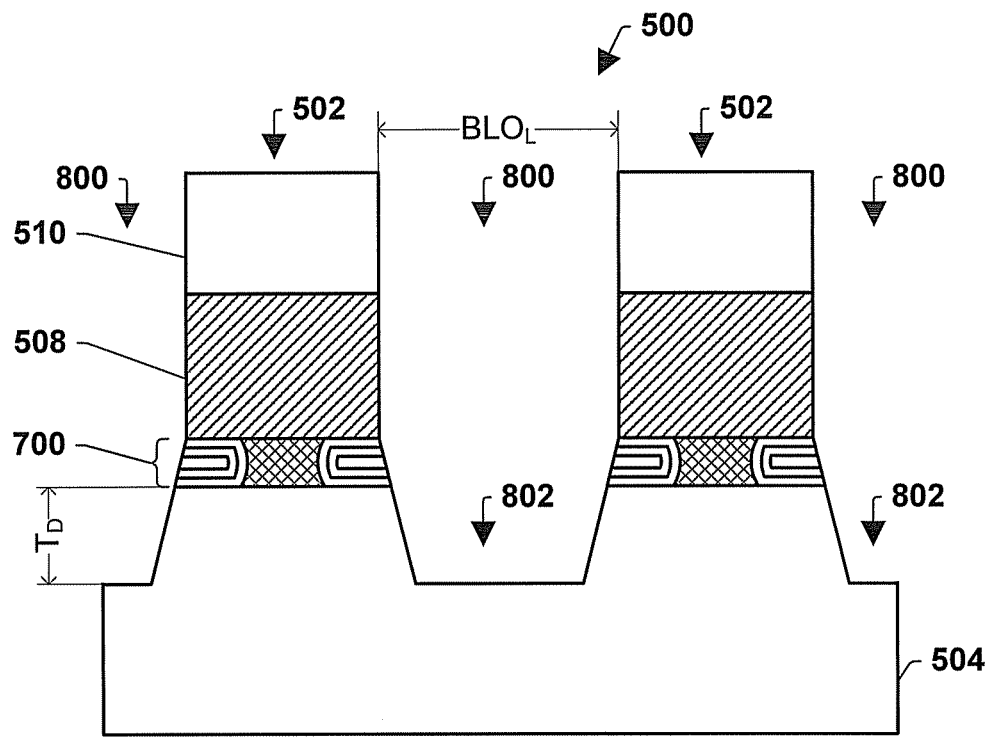
FIG. 8 illustrates forming bit line openings by removing portions of semiconductor substrate under first openings in accordance with a second aspect of the subject invention.

FIG. 8 illustrates forming a bit line opening 800 by removing a portion of semiconductor substrate 504 under the first opening 512 (e.g., by forming a bit line trench 802 under the first opening 512 in the semiconductor substrate 504). The portion of semiconductor substrate 504 under the first opening 512 can be removed by using the patterned first mask layer 510 as a mask.

The portion of the semiconductor substrate 504 can be removed by any suitable technique, for example, etching. For example, a portion of the semiconductor substrate 504 can be removed by contacting the substrate with any suitable etchant that does not substantially damage and/or remove other components of the memory device 500. Wet etching and/or dry etching containing isotropic etching and/or anisotropic etching can be employed. When the semiconductor substrate 504 contains silicon, examples of wet etchants include tetraalkylammonium hydroxides (e.g., tetramethylammonium hydroxide (TMAH)) and alkali metal hydroxides (e.g., a potassium hydroxide (KOH) and cerium hydroxide (CeOH)). Examples of dry etching include reactive ion etching (RIE) using, for example, a mixture gas containing HBr (e.g., HBr and $O_2$ mixture gas, HBr/$NF_3$/He and $O_2$ mixture gas, $SF_6$, HBr and $O_2$ mixture gas). The mixture may further include $Cl_2$.

The bit line opening 800 can have any suitable length ($BLO_L$) that depends on, for example, the desired bit line pitch, the desired implementations, and/or the memory device 500 being fabricated. In one embodiment, the bit line opening 800 has a length ($BLO_L$) of about 10 nm or more and about 190 nm or less. In another embodiment, the bit line opening 800 has a length ($BLO_L$) of about 20 nm or more and about 100 nm or less. In yet another embodiment, the bit line opening 800 has a length ($BLO_L$) of about 30 nm or more and about 70 nm or less. In still yet another embodiment, the bit line opening 800 has a length ($BLO_L$) of about 50 nm.

The bit line trench 802 in the semiconductor substrate 504 can have any suitable cross-sectional shape. In one embodiment, the bit line trench 802 has relatively sloping sidewalls that extend perpendicular to the topological surface of the semiconductor substrate 504. In another embodiment, the bit line trench 802 has relatively vertical sidewalls (not shown). The bit line trench 802 can have any suitable depth. The depth ($T_D$) of the bit line trench 802 may vary and is not critical to the subject invention. The depth ($T_D$) of the bit line trench 802 may depend on, for example, the desired implementations and/or the memory device 500 being fabricated. In one embodiment, the depth ($T_D$) of the bit line trench 802 is about 10 nm or more and about 100 nm or less. In another embodiment, the depth ($T_D$) of the bit line trench 802 is about 20 nm or more and about 90 nm or less. In yet another embodiment, the depth ($T_D$) of the bit line trench 802 is about 30 nm or more and about 70 nm or less.

Figure 9:
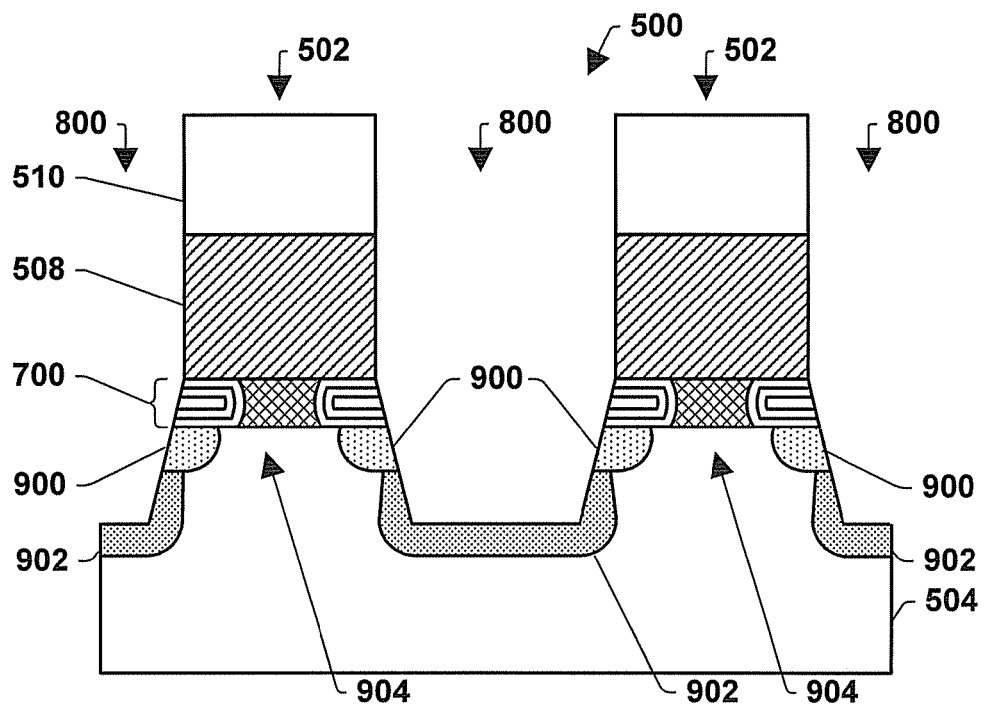
FIG. 9 illustrates forming pocket implant regions in a semiconductor substrate adjacent or under features and forming first bit lines in a semiconductor substrate under bit line openings in accordance with a second aspect of the subject invention.

FIG. 9 illustrates forming pocket implant regions 900 in the semiconductor substrate 504 adjacent or under the charge storage nodes 700 and forming first bit lines 902 in the semiconductor substrate 504 under the bit line openings 800. The pocket implant regions 900 can be formed within the semiconductor substrate 504 by any suitable technique. For example, the pocket region 900 is formed via implantation of one or more dopants at an angle with respect to the surface of the semiconductor substrate 504. The dopants pass through the bit line opening 800 and are implanted adjacent to and to a certain degree under portions of the charge storage nodes 700 depending upon the angle of implantation. The dopants can, for example, be implanted at an angle of about 5 degrees or more and about 40 degrees or less relative to the surface of the semiconductor substrate 504. Any suitable implant compositions and concentrations for the pocket implants can be employed. For example, the dopants include one or more p-type dopants, such as boron. Such dopants can be implanted at an energy level of about 3 KeV or more and about 30 KeV or less and a dose of about 1E12 atoms/$cm^2$ or more and 5E15 atoms/$cm^2$ or less, for example. Although not shown, the pocket implant regions 900 can be formed prior to formation of the bit line trench 802.

The first bit lines 902 can be formed adjacent the charge storage nodes 700 and under the bit line opening 800 within the semiconductor substrate 504 by any suitable technique. For example, the first bit line 902 is formed via implantation of one or more dopants. The dopants pass through the bit line opening 800 and are implanted into the semiconductor substrate 504 under the bit line opening 800, leaving a channel region 904 of the semiconductor substrate 504 between the first bit lines 902. Any suitable implant compositions and concentrations can be employed for the first bit lines 902. For example, the first bit lines 902 include one or more n-type dopants (e.g., arsenic, phosphorous, antimony). Such dopants can be implanted at a dose of about 0.2E15 atoms/$cm^2$ or more and about 4E15 atoms/$cm^2$ or less and at an energy level of about 2 KeV or more and about 40 KeV or less, for example. Further, the semiconductor substrate 504 can contain other bit line implants. The buried first bit lines 902 can act as respective sources and drains for corresponding memory cells. As such, respective channels 904 are defined between corresponding pairs of buried first bit lines 902.

Figure 10:
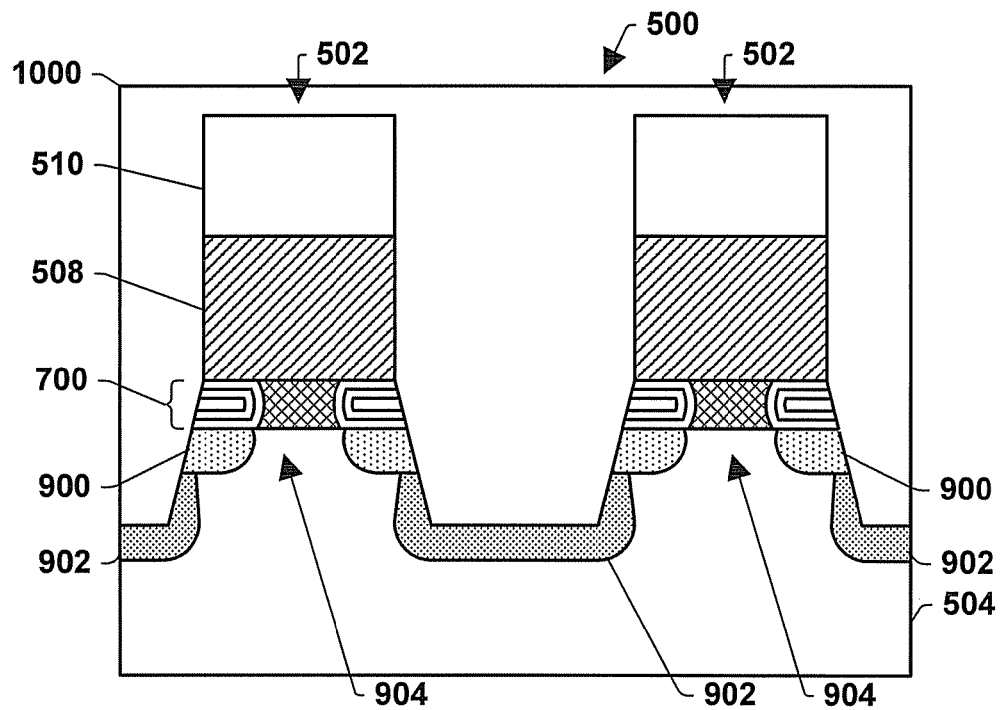
FIG. 10 illustrates forming a bit line dielectric layer over the semiconductor substrate in accordance with a second aspect of the subject invention.

FIG. 10 illustrates forming a bit line dielectric layer 1000 over the semiconductor substrate 504. The bit line dielectric layer 1000 can contain any suitable dielectric material such as oxides. Examples of oxides include silicon oxide, tetraethylorthosilicate (TEOS) oxide, high aspect ratio plasma (HARP) oxide, HTO, HDP oxide, and the like.

The bit line dielectric layer 1000 can be formed by any suitable technique. In one embodiment, the bit line dielectric layer is formed by a HTO deposition process. For example, the HTO is formed by low pressure chemical vapor deposition (LPCVD) using nitrous oxide ($N_2O$) and dichlorosilane ($SiH_2Cl_2$) gasses at a temperature of about 600 degrees Celsius or more and about 900 degrees Celsius or less and a pressure of about 100 mTorr or more and about 500 mTorr or less. In another embodiment, the bit line dielectric layer is grown in plasma at low temperatures, e.g., plasma-grown oxide. For example, the bit line dielectric layer contains plasma-grown oxide that is grown at a temperature of about 250 degrees Celsius or more and about 600 degrees Celsius or less. The bit line dielectric layer may be formed by a HDP deposition process. The bit line dielectric layer can be optionally subjected to an anneal in, for example, a nitrogen ambient at about 1000 degrees Celsius for thirty minutes.

Figure 11:
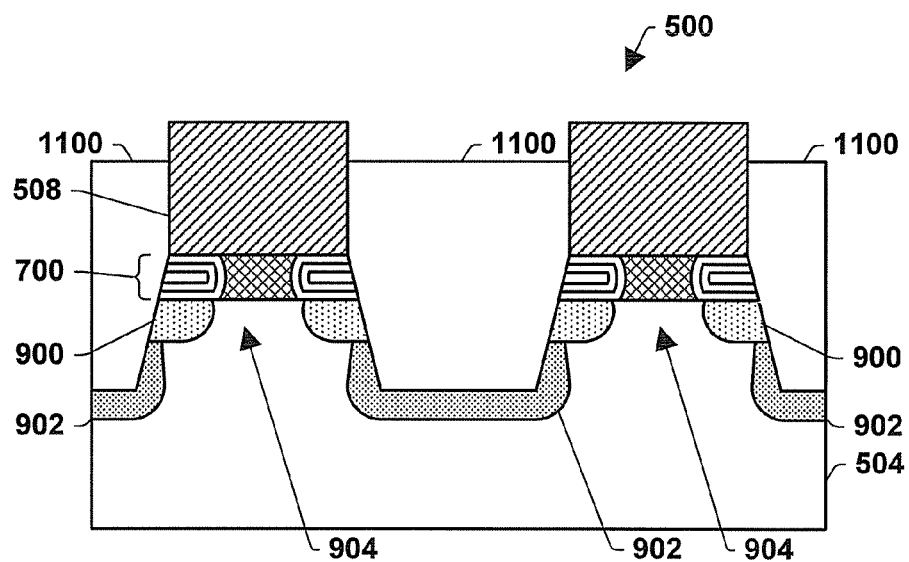
FIG. 11 illustrates removing an upper portion of a bit line dielectric layer in accordance with a second aspect of the subject invention.

FIG. 11 illustrates removing the first mask layer 510 and removing an upper portion of the bit line dielectric layer 1000, thereby forming bit line dielectrics 1100 in the bit line openings 800. The first mask layer 510 can be removed by any suitable technique. For example, when the first mask layer 510 contains nitride materials, the first mask layer 510 can be removed by contacting the first mask layer 510 with any suitable nitride etchant that does not substantially affect or damage the integrity of other layers in the memory device 500 such as the first poly layer 508. Examples of nitride etchants include phosphoric acid. Other nitride etchants can also be used as long as they are capable of removing the first mask layer 510 selective to other layers such as the first poly layer 508.

The upper portion of the bit line dielectric layer 1000 can be removed by any suitable technique. For example, the upper portion of the bit line dielectric layer 1000 is removed by chemical-mechanical polishing (CMP) and/or etching. For example, the upper portion of the bit line dielectric layer 1000 is polished by CMP down to the upper surface of the first mask layer 510 under any suitable condition to facilitate removing/polishing the upper portion. The conditions generally depend upon, for example, the thickness of the bit line dielectric layer, the composition of the bit line dielectric layer, the desired implementations and/or the memory device 500 being fabricated, and the like. In another embodiment, the upper portion of the bit line dielectric layer 1000 is removed by contacting the upper portion with any suitable oxide etchant under any suitable condition that can remove the upper portion of the bit line dielectric layer 1000 but does not substantially damage and/or remove other components of the memory device 500.

The upper portion of the bit line dielectric layer 1000 can be further removed by etching. For example, when the bit line dielectric layer 1000 contains oxide materials, the upper portion of the bit line dielectric layer 1000 can be removed by contacting the bit line dielectric layer 1000 with any suitable oxide etchant that does not substantially affect or damage the integrity of other layers in the memory device 500 such as the first poly layer 508. Examples of oxide etchants include halogen acids such as hydrofluoric acid. In one embodiment, the oxide etchant is a hydrofluoric acid solution such as a buffered hydrofluoric acid (BHF: e.g., hydrofluoric acid-ammonium fluoride buffered solution). In another embodiment, the oxide etchant is a vapor of hydrofluoric acid. Other oxide etchants can also be used as long as they are capable of removing portions of the bit line dielectric layer 1000 selective to other layers such as the first poly layer 508.

Any suitable amount of the upper portion of the bit line dielectric layer 1000 can be removed. In one embodiment, the upper surface of the first poly layer 508 is higher than the resultant upper surface of the bit line dielectric layer 1000. In another embodiment, the upper surface of the first poly layer 508 is substantially coplanar with the resultant upper surface of the bit line dielectric layer 1000 (not shown). In yet another embodiment, the upper surface of the first poly layer 508 is lower than the resultant upper surface of the bit line dielectric layer 1000 (not shown). Due to the removal of the upper portion of the bit line dielectric layer, the upper surface of the first poly layer 508 can be exposed.

Figure 12:
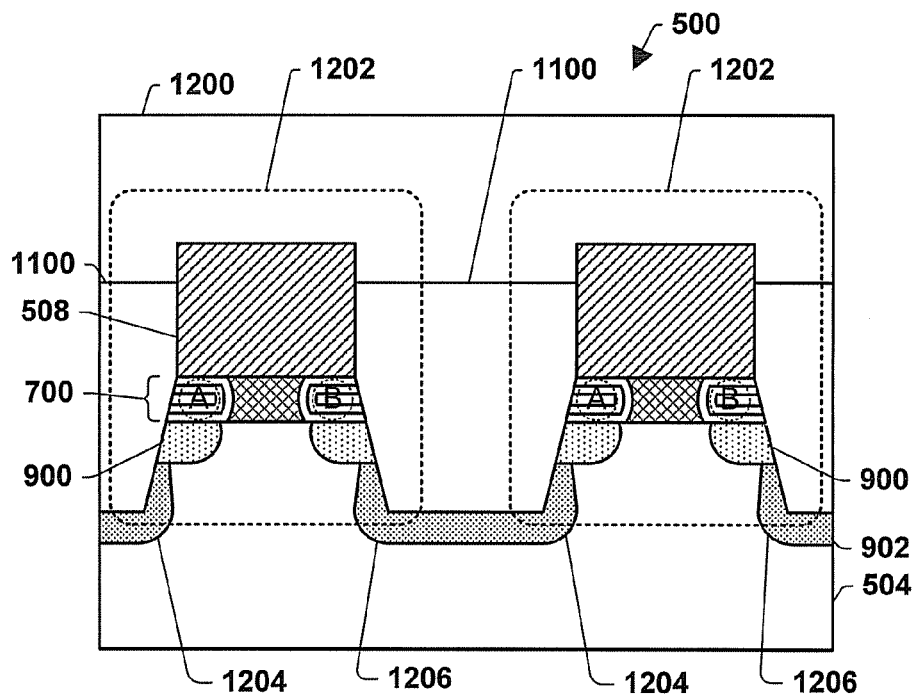
FIG. 12 illustrates forming a word line over a semiconductor substrate, thereby forming a memory cell on a semiconductor substrate in accordance with a second aspect of the subject invention.

FIG. 12 illustrates forming a word line 1200 over the semiconductor substrate 504, thereby forming a memory cell 1202 on the semiconductor substrate 504. The word line 1200 can contain any suitable conductive material such as polysilicon. The word line 1200 can be formed by, for example, forming a layer of word line material over the semiconductor substrate 504 and patterning (e.g., etching) the layer to establish the word line 1200 over the first bit lines 902. The first bit lines 902 and the word line 1200 are oriented at substantially right angles relative to one another.

The memory cell 1202 contains the charge storage node 700 on a semiconductor substrate 504 and the first poly gate 704 on the charge storage node 700. The memory cell 1202 contains two pocket implant regions 900 adjacent or under the charge storage node 700 in the semiconductor substrate 504 and the first bit line 902 under the bit line opening 800 in the semiconductor substrate 504. The charge storage node 700 can contain two charge storage nodes. The memory cell 1202 may or may not contain a central dielectric 600 between two charge storage nodes. When the memory cell 1202 contain a central dielectric 600, the memory cell 1202 contains at least two charge storage nodes 700 separated by the central dielectric 600. The memory cells 1202 are separated by the bit line dielectric 1100 in the bit line opening 800. The upper surface of the bit line dielectric 1000 is lower than the upper surface of the first poly gate 1306.

The charge storage nodes 700 can store at least a bit of information, respectively. For example, the memory cell 1202 is capable of storing two spatially separated binary data bits, including a left bit represented by the dashed circle A and a right bit represented by the dashed circle B. When the memory cell 1202 is such a dual-bit memory cell, the dual-bit memory cell is generally symmetrical, wherein a drain and a source are interchangeable, although asymmetric implementations are possible within the scope of the invention. In the exemplary memory cell 1202, the left first bit lines 1204 may serve as the source terminal and the right first bit lines 1206 as the drain terminal with respect to the right bit. Likewise, the right first bit lines 1206 may serve as the source terminal and the left first bit lines 1204 as the drain terminal for the left bit. The subject invention may be implemented in association with various single or multi-bit memory cell types including a SONOS cell. In addition, the invention is applicable to such dual-bit memory devices wherein both bits are used for data or information storage, as well as those in which only one bit (e.g., bit A) of the dual-bit cell is so used.

Figure 13:
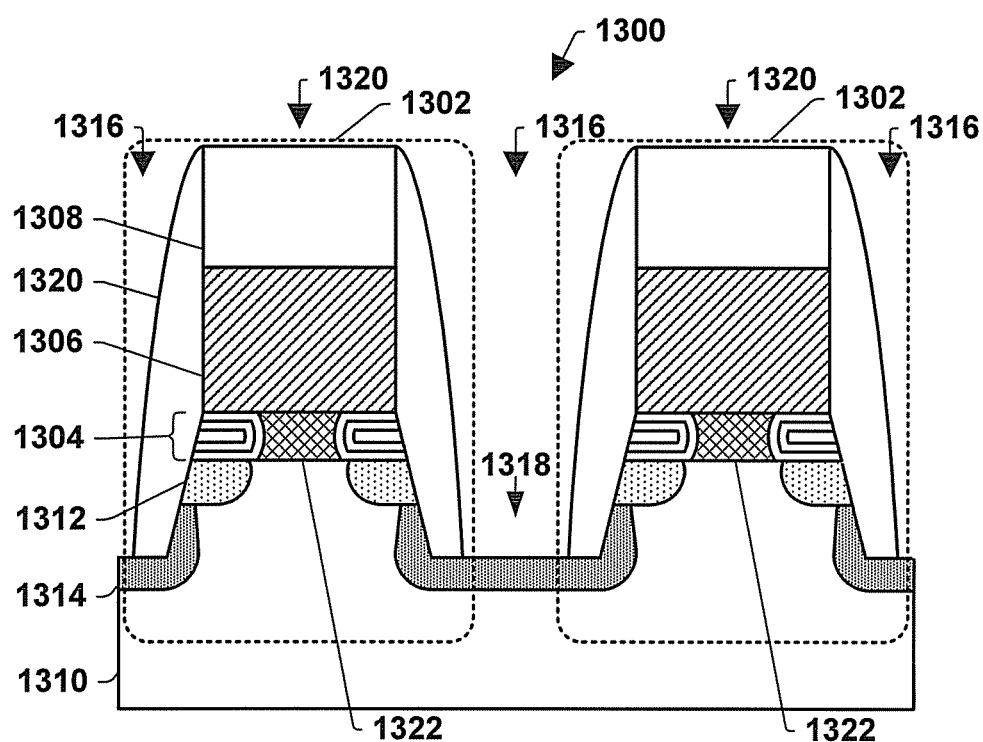
FIG. 13 illustrates a cross sectional view of an intermediate state of a portion of another exemplary memory device in accordance with a third aspect of the subject invention.

FIG. 13 illustrates a cross sectional view of an intermediate state of a portion of another exemplary memory device 1300. The intermediate state of the memory device 1300 contains an intermediate state of one or more memory cells 1302. The intermediate state of the memory cell 1302 contains a feature 1320 on a semiconductor substrate 1310. The feature 1320 contains charge storage nodes 1304, a first poly gate 1306, and a first mask layer 1308. The intermediate state of the memory cell 1302 contains two pocket implant regions 1312 adjacent or under the charge storage node 1304 in the semiconductor substrate 1310 and two first bit lines 1314 under bit line openings 1316 in the semiconductor substrate 1310. The intermediate state of the memory cells 1302 are separated from each other by the bit line openings 1316. The bit line opening 1316 includes a bit line trench 1318 that extends into the semiconductor substrate 1310. The bit line opening 1316 contains a spacer 1320 adjacent to side surfaces of the first poly gate 1306, the charge storage node 1304, and the bit line opening 1316 (e.g., bit line trench 1318). The charge storage nodes 1304 may or may not be separated by a central dielectric 1322. The intermediate state of the memory cell 1302 contains the same structure as the intermediate state of the memory cell in connection with FIG. 9 except the spacer 1320.

The spacer 1320 can contain any suitable materials as long as the spacer can serve as an implant screen (e.g., implant mask) in a subsequent implantation process. Examples of spacer materials include polymers (e.g., organic polymers). For example, F-containing organic polymers and Br-containing organic polymers can be employed. When using organic polymer spacers, the spacers can be easily removed after the subsequent implantation process. The polymer may be self-patternable (without the need for a photoresist) or nonself-patternable (requiring the use of a photoresist or mask to be patterned). In some instances, the use of self-patternable polymer can eliminate the necessity to perform photolithographic processes in fabricating the memory device.

Specific examples of polymers include polyimides, fluorinated polyimides, polysilsequioxanes such as hydrogen polysilsequioxanes, methyl polysilsequioxanes, butyl polysilsequioxanes, and phenyl polysilsequioxanes, benzocyclobutenes (BCB), fluorinated benzocyclobutene, polyphenylene, polysilazanes, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), fuorinated poly(arylene ether), fluorinated parylenes, poly(p-xylxylenes), fluorinated poly(p-xylxylenes), parylene F, parylene N, parylene C, parylene D, amorphous polytetrafluoroethylene, polyquinoline, polyphenylquinoxalines, polymeric photoresist materials, and the like.

Although the spacer 1320 can contain any suitable material, formation of the spacer is hereinafter illustrated and described in the context of an exemplary polymer spacer. The polymer spacer 1320 can be formed by any suitable method, for example, forming a layer containing the polymer spacer material over the substrate 1310 and then removing portions of the spacer material layer not near the side surfaces of the first poly gate 1306 and the charge storage node 1304 in the bit line opening 1316. A layer containing the spacer material can be formed at least over the side surfaces of the first poly gate 1306 and the charge storage node 1304 in the bit line opening 1316.

The spacer material layer can be formed by any suitable technique. For example, the spacer material layer is formed using either spin-on or CVD techniques. In CVD, there may be no organic solvent used during resist deposition. CVD includes pulsed plasma enhanced chemical vapor deposition (PECVD) and pyrolytic CVD as well as continuous PECVD. For example, plasma polymerization is a common method for depositing fluorocarbon polymer dielectrics. PECVD uses continuous radio frequency (rf) power to excite the precursor gases in order to deposit films within the glow discharge region. The spacer material layer can be conformal over the surface of the memory device 1300.

Portions of the spacer material layer not near the side surfaces of the first poly gate 1306 and the charge storage node 1304 in the bit line opening 1316 can be removed by any suitable technique. For example, the portions of the spacer material layer are removed by etching. In one embodiment, the portions of the spacer material layer are etched by anisotropic polymer etching using, for example, RIE or plasma etching. Examples of etchants include a mixture gas of chlorine, fluourine, and oxygen, a mixture gas of HBr, $O_2$ and He, and the like.

In one embodiment, the formation of the spacer material layer and the removal of the portions of the spacer material layer are performed in two or more separate apparatuses (e.g., tools, chambers). For example, the spacer material layer is formed at high temperatures (e.g., about 400 degrees Celsius) in a CVD chamber, while portions of the spacer material layer are etched at low temperatures (e.g., about 20 degrees Celsius) in a plasma etching chamber.

In another embodiment, the formation of the spacer material layer and the removal of the portions of the spacer material layer are performed within a single apparatus (e.g., tool, chamber). For example, both processes can be performed in a plasma chamber. For forming a spacer material layer, hydrocarbon gases (e.g., $C_4$, $C_2H_2$, and the like), fluorocarbon-based gas (e.g., $CH_3F$, $CHF_3$, $CF_4$, and the like), or combinations thereof are introduced to a plasma chamber. Other inorganic gases (e.g., HBr, Ar, $H_2$, and the like) may be also introduced into the chamber.

A spacer material layer can be formed at a low ion bombardment energy. In one embodiment, the spacer material layer is formed at an ion bombardment energy of about 0.05 eV or more and about 5 eV or less. In another embodiment, the spacer material layer is formed at an ion bombardment energy of about 0.1 eV or more and about 4 eV or less. In yet another embodiment, the spacer material layer is formed at an ion bombardment energy of about 0.2 eV or more and about 3 eV or less. In still yet another embodiment, the formation is performed using only an inductively coupled plasma (ICP) power. When the spacer material layer is formed at a low ion bombardment energy, the resulting spacer material layer has good conformality over the surface of the memory device 1300. Subsequently, the spacer material layer is etched in the same plasma chamber. For etching of the spacer material layer, similar gases may be used, though with less polymerizing gas mixtures and possibly with $O_2$ or other oxidizing or reducing gases added.

Figure 14:
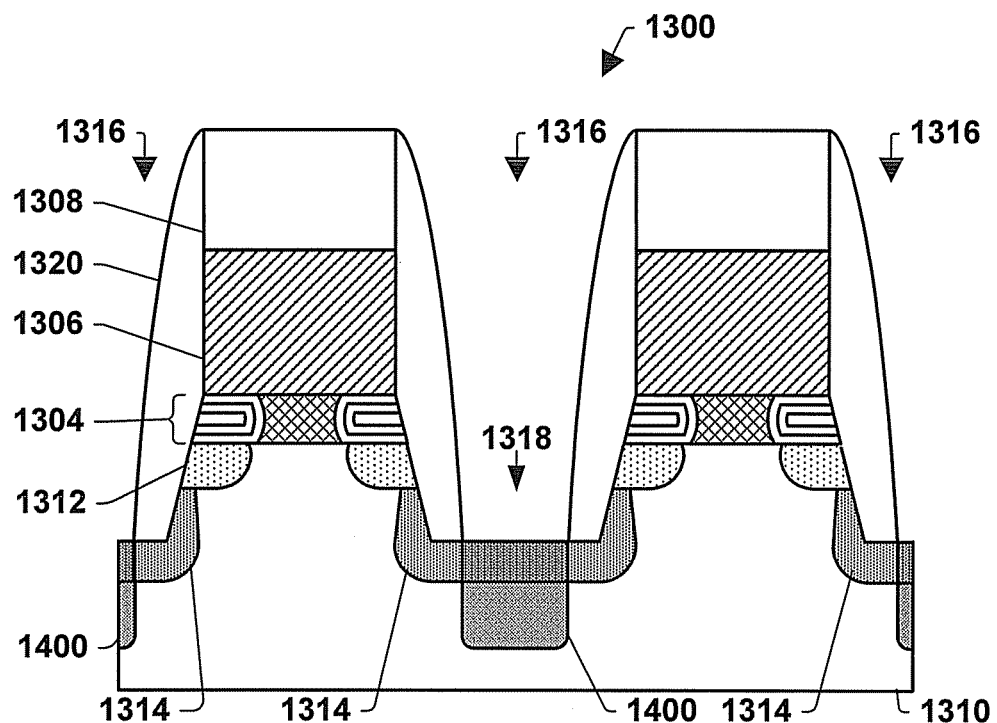
FIG. 14 illustrates forming a second bit line in a semiconductor substrate under a bit line opening in accordance with a third aspect of the subject invention.

FIG. 14 illustrates forming a second bit line 1400 in the semiconductor substrate 1310 under the bit line openings 1316. The second bit line 1400 can be formed within the semiconductor substrate 1310 by any suitable technique. For example, the second bit line 1400 is formed in the same manner as described for formation of the first bit line 902 in connection with FIG. 9. The first mask layer 1308 and the spacer 1320 can serve as an implant screen. The second bit line 1400 can contain one or more n-type dopants (e.g., arsenic, phosphorous, antimony).

Figure 15:
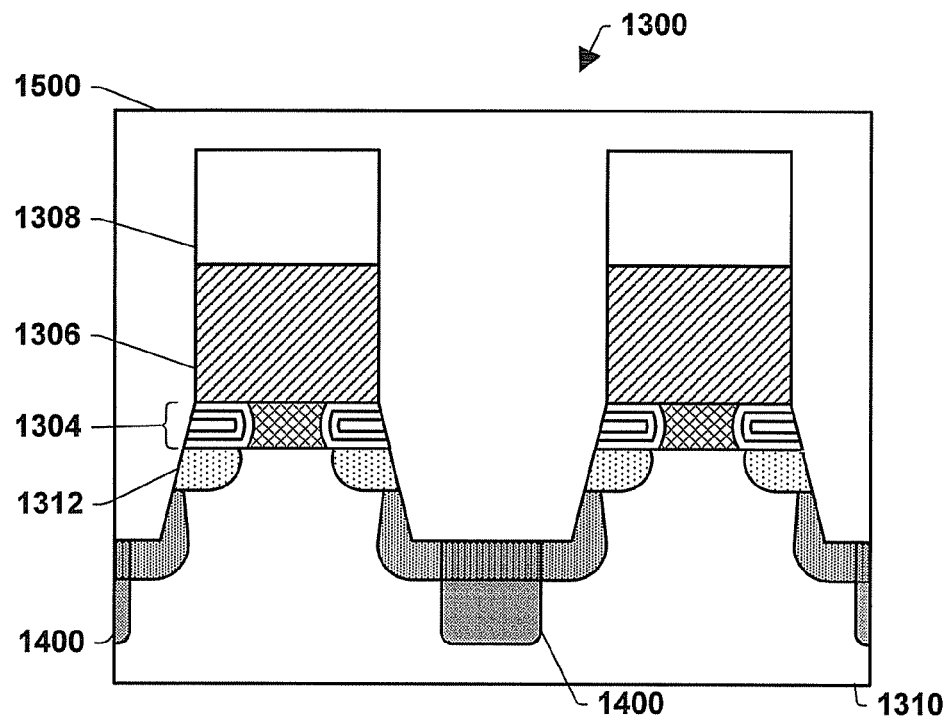
FIG. 15 illustrates forming a bit line dielectric layer over a semiconductor substrate in accordance with a third aspect of the subject invention.

FIG. 15 illustrates removing the spacers 1320 and forming a bit line dielectric layer 1500 over the semiconductor substrate 1310. The spacer 1320 can be removed by any suitable technique. For example, the spacers 1320 are removed by etching. In one embodiment, the spacers 1320 are etched by polymer etching using, for example, RIE or plasma etching. Examples of etchants include a mixture gas of chlorine, fluourine, and oxygen, a mixture gas of HBr, $O_2$ and He, and the like.

The bit line dielectric layer 1500 can contain any suitable dielectric material such as oxides. Examples of oxides include silicon oxide, tetraethylorthosilicate (TEOS) oxide, high aspect ratio plasma (HARP) oxide, HTO, HDP oxide, and the like. The bit line dielectric 1500 can be formed by any suitable technique. For example, the bit line dielectric layer 1500 is formed in the same manner as described for formation of the bit line dielectric 1000 in connection with FIG. 10.

Figure 16:
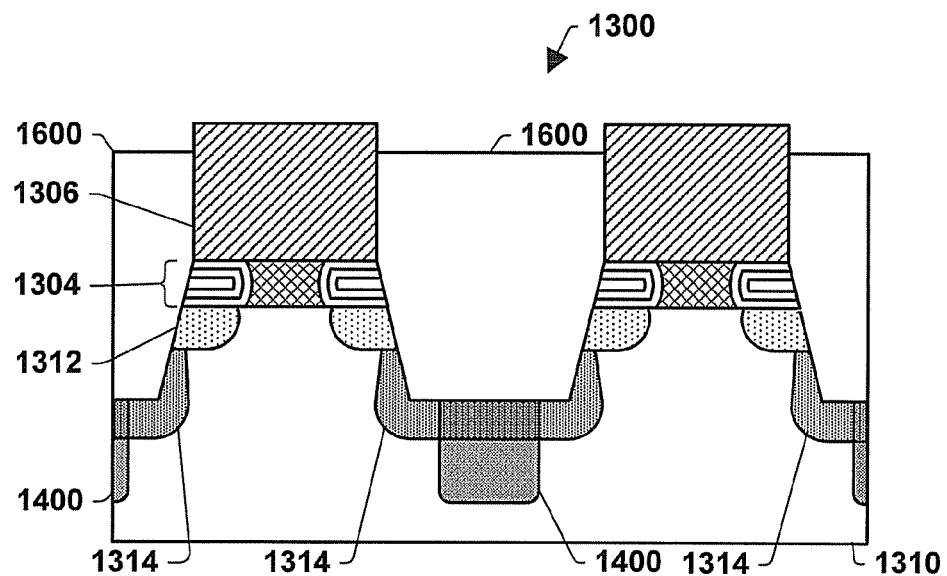
FIG. 16 illustrates removing an upper portion of a bit line dielectric layer in accordance with a third aspect of the subject invention.

FIG. 16 illustrates removing the first mask layer 1308 and removing an upper portion of the bit line dielectric layer 1500, thereby forming a bit line dielectric 1600 in the bit line opening 1316. The first mask layer 1308 and the upper portion of the bit line dielectric layer 1500 can be removed by any suitable technique. For example, the patterned first mask 1308 and the upper portion of the bit line dielectric layer 1500 are removed in the same manner as described for removal of the patterned first mask layer 510 and the upper portion of the bit line dielectric layer 1000 in connection with FIG. 11.

Figure 17:
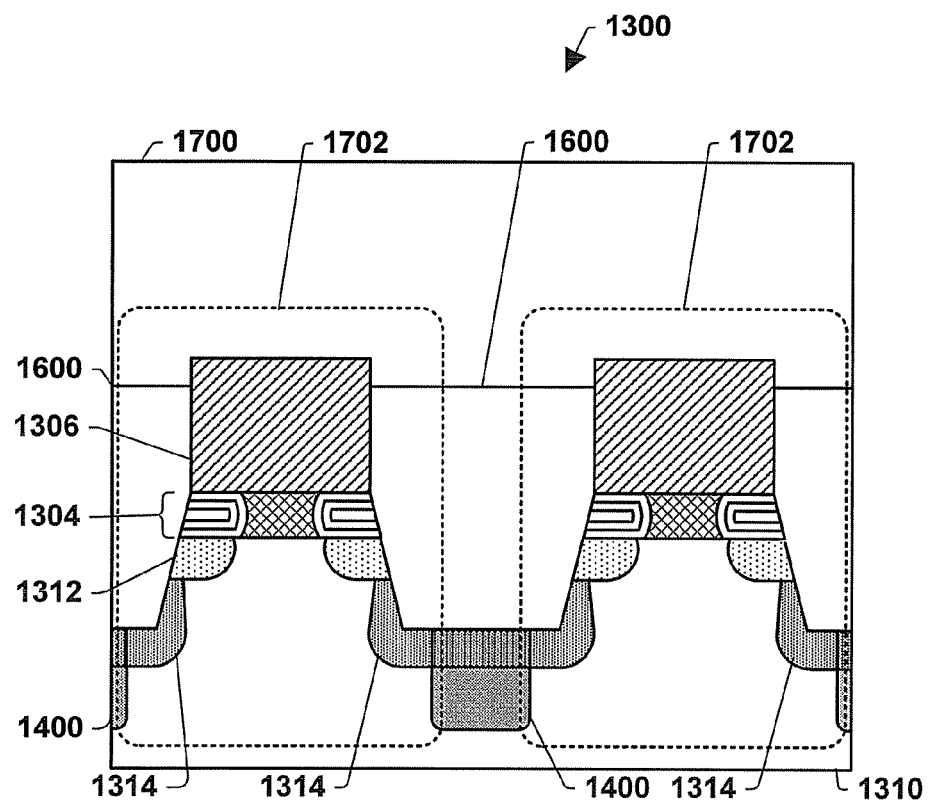
FIG. 17 illustrates forming a word line over a semiconductor substrate, thereby forming a memory cell on a semiconductor substrate in accordance with a third aspect of the subject invention.

FIG. 17 illustrates forming a word line 1700 over the semiconductor substrate 1310, thereby forming a memory cell 1702 on the semiconductor substrate 1310. The memory cell 1702 contains the charge storage node 1304 on the semiconductor substrate 1310 and the first poly gate 1306 on the charge storage node 1304. The memory cell 1702 contains two pocket implant regions 1312 adjacent or under the charge storage node 1304 in the semiconductor substrate 1310, and the first bit line 1314 and the second bit line 1400 adjacent the charge storage node 1304 and under the bit line openings 1316 in the semiconductor substrate 1310. The memory cell 1702 may or may not contain a central dielectric 1322 between the charge storage nodes 1304. The memory cells 1702 are separated by the bit line dielectric 1500 in the bit line openings 1316. The upper surfaces of the bit line dielectric 1500 can be lower than the upper surface of the first poly gate 1306.

Figure 18:
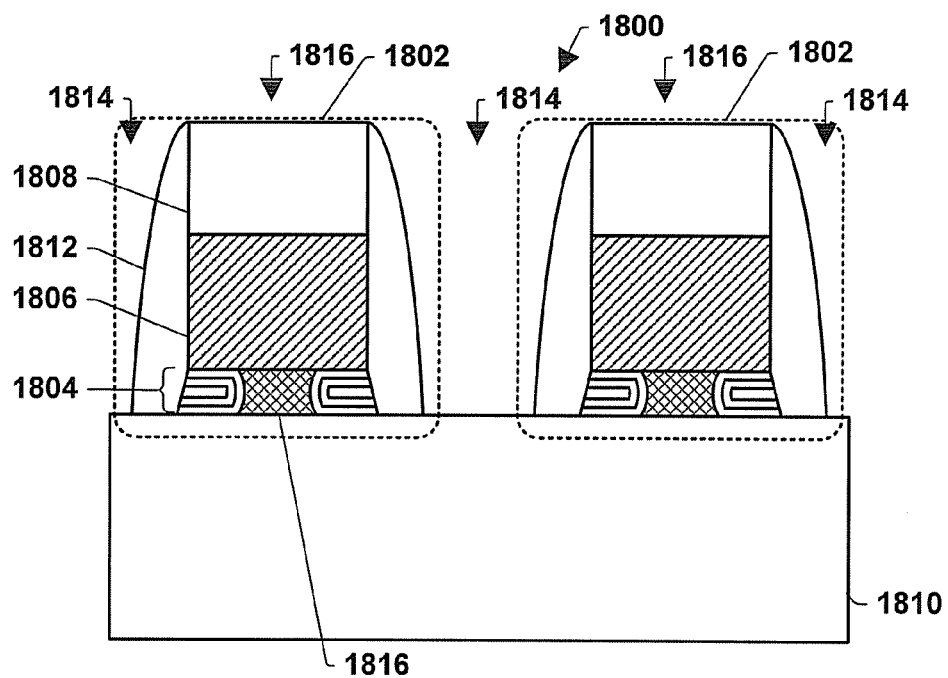
FIG. 18 illustrates a cross sectional view of an intermediate state of a portion of another exemplary memory device in accordance with a fourth aspect of the subject invention.

FIG. 18 illustrates a cross sectional view of an intermediate state of a portion of another exemplary memory device 1800. The intermediate state of the memory device 1800 contains an intermediate state of one or more memory cells 1802. The intermediate state of the memory cell 1802 contains a feature 1816 on a semiconductor substrate 1810. The feature can contain charge storage nodes 1804, a first poly gate 1806, and a first mask layer 1808. The intermediate state of the memory cell 1802 further contains spacers 1812 adjacent to the side surfaces of the charge storage node 1804, the first poly gate 1806, and the first mask layer 1808 in first openings 1814. The charge storage nodes 1804 may or may not be separated from each other by a central dielectric 1816. The intermediate state of the memory cell 1802 contains the same structure as the intermediate state of the memory cell in connection with FIG. 7 except the spacer 1812.

The spacer 1812 can contain any suitable material. For example, the spacer 1812 contains any of the materials with the spacer 1320 as described above in connection with FIG. 13. The spacer 1812 can be formed by any suitable technique. For example, the spacer 1812 is formed in the same manner as described for forming the spacer 1320 in connection with FIG. 13.

Figure 19:
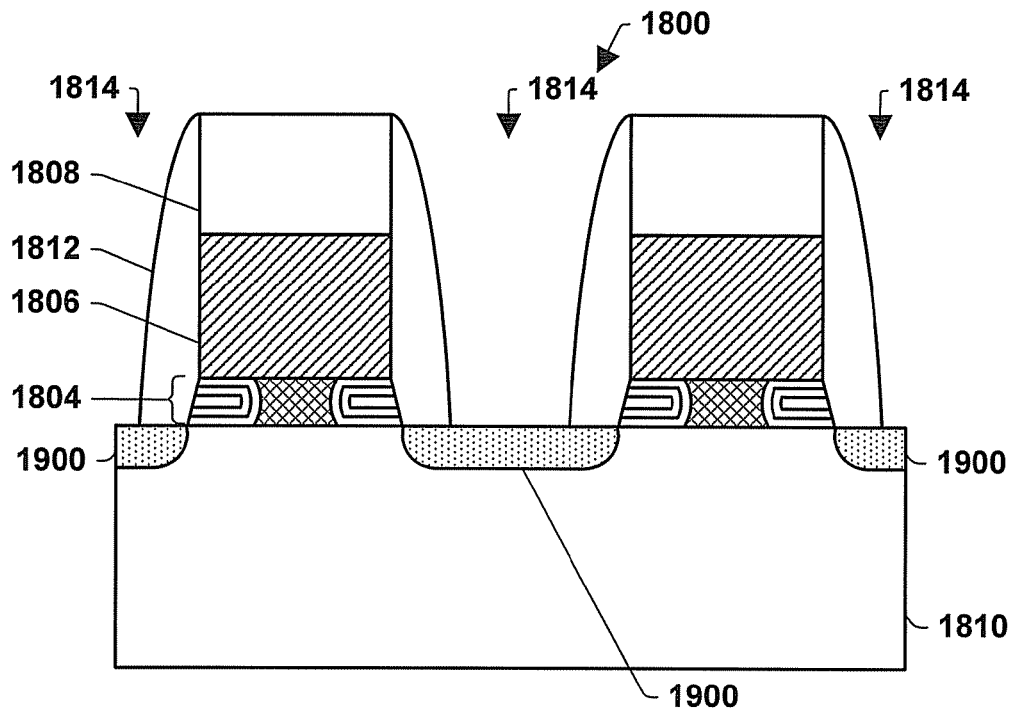
FIG. 19 illustrates forming pocket implant regions adjacent a charge storage node in a semiconductor substrate in accordance with a fourth aspect of the subject invention.

FIG. 19 illustrates forming pocket implant regions 1900 adjacent the charge storage node 1804 in the semiconductor substrate 1810 (e.g., under the first opening 1814 in the semiconductor substrate 1810). The pocket implant region 1900 can be formed within the substrate 1810 by any suitable technique. For example, the pocket implant region 1900 is formed in the same manner as described for formation of pocket implant regions 900 in connection with FIG. 9. The first mask layer 1808 and the spacer 1812 can serve as an implant screen.

Figure 20:
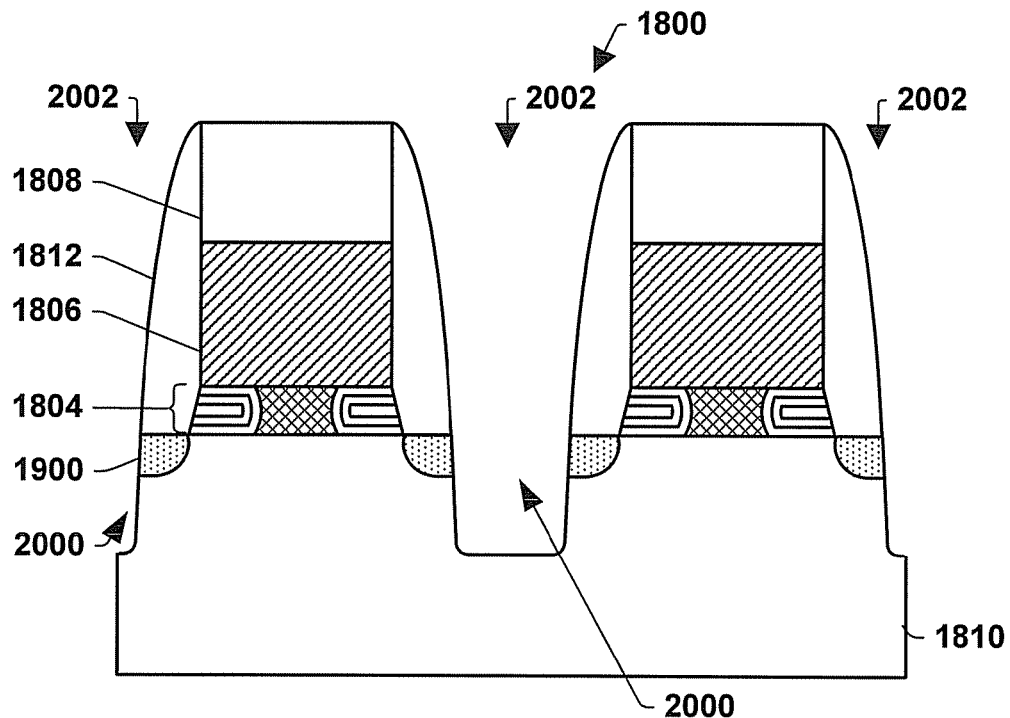
FIG. 20 illustrates forming a bit line trench under a first opening in a semiconductor substrate, thereby forming a bit line opening in accordance with a fourth aspect of the subject invention.

FIG. 20 illustrates forming bit line trenches 2000 under the first opening 1814 in the semiconductor substrate 1810, thereby forming bit line openings 2002. The bit line trench 2000 can be formed by removing a portion of the semiconductor substrate 1810 under the first opening 1814 using the first mask 1808 and the spacer 1812 as a mask. The bit line trench 2000 can be formed in the same manner as described for forming the bit line trench 802 in connection with FIG. 8. Although not shown in the Figures, in one embodiment, the bit line trenches 2000 are formed and then the pocket implant regions 1900 are formed.

Figure 21:
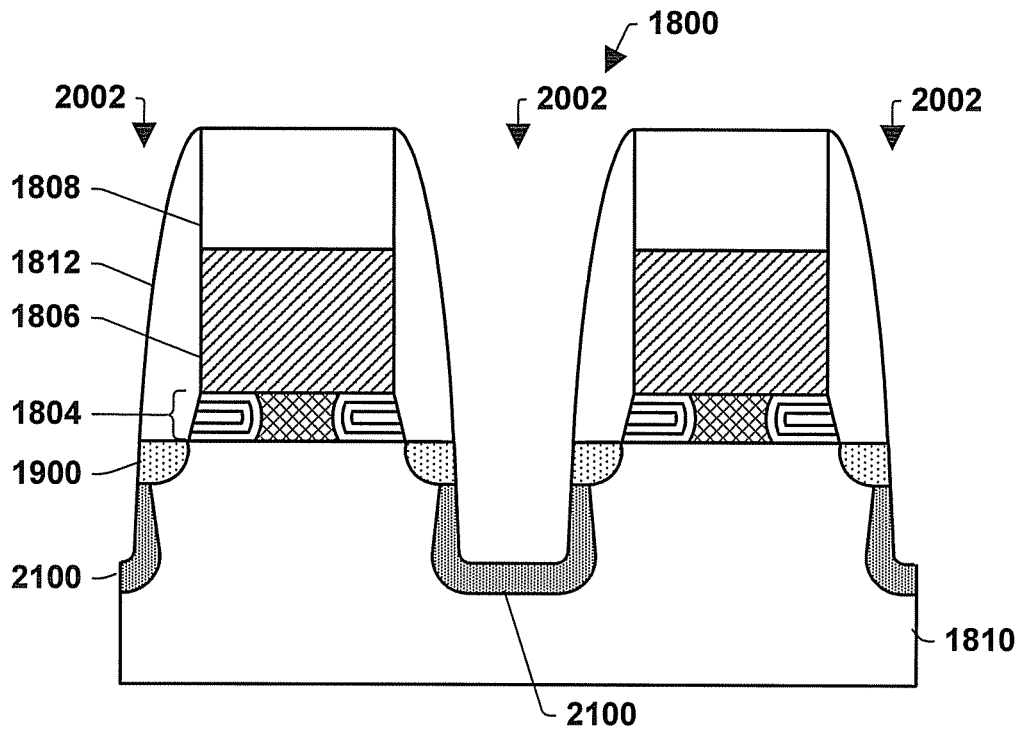
FIG. 21 illustrates forming a first bit line adjacent a charge storage node and under a bit line opening in a semiconductor substrate in accordance with a fourth aspect of the subject invention.

FIG. 21 illustrates forming a first bit line 2100 adjacent the charge storage node 1804 and under the bit line opening 2002 in the semiconductor substrate 1810. The first bit line 2100 can be formed by any suitable technique. For example, the first bit line 2100 is formed in the same manner as described for forming the first bit line 902 in connection with FIG. 9. Although not shown, a second bit line can be formed in the semiconductor substrate 1810 under the bit line opening 2002 between the spacers 1812 in the same manner as described for formation of the second bit line 1400 in connection with FIG. 14.

Figure 22:
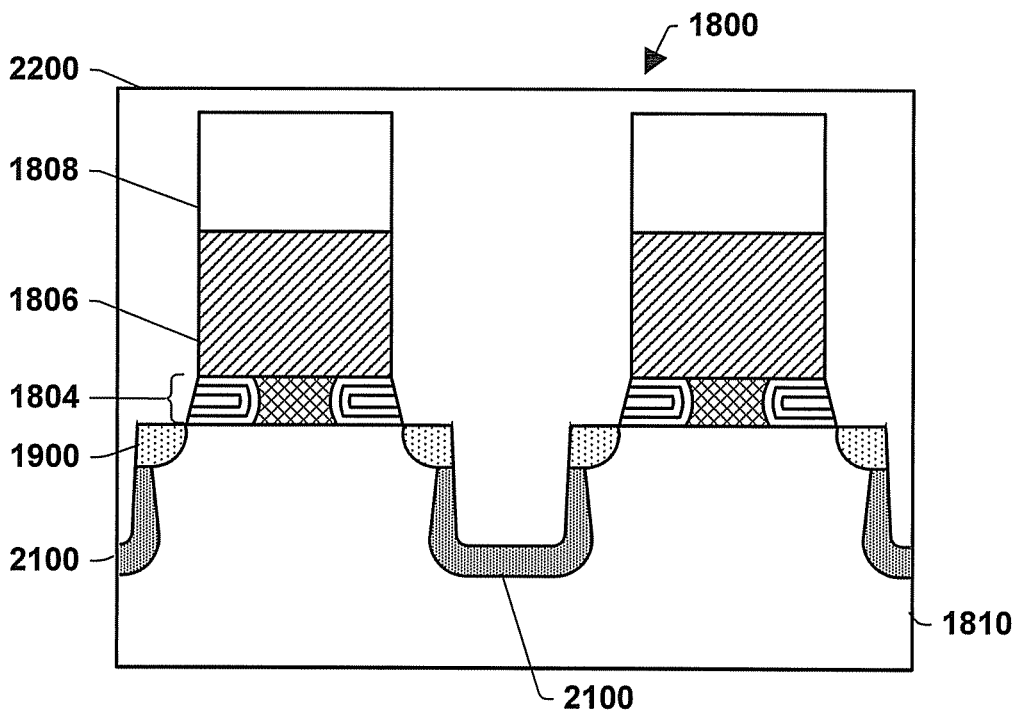
FIG. 22 illustrates forming a bit line dielectric layer over a semiconductor substrate in accordance with a fourth aspect of the subject invention.

FIG. 22 illustrates forming a bit line dielectric layer 2200 over the semiconductor substrate 1810. The bit line dielectric layer 2200 can contain any suitable dielectric material such as oxides. Examples of oxides include silicon oxide, tetraethylorthosilicate (TEOS) oxide, high aspect ratio plasma (HARP) oxide, HTO, HDP oxide, and the like. The bit line dielectric layer 2200 can be formed any suitable technique. For example, the bit line dielectric layer 2200 is formed in the same manner as described for formation of the bit line dielectric 1000 in connection with FIG. 10.

Figure 23:
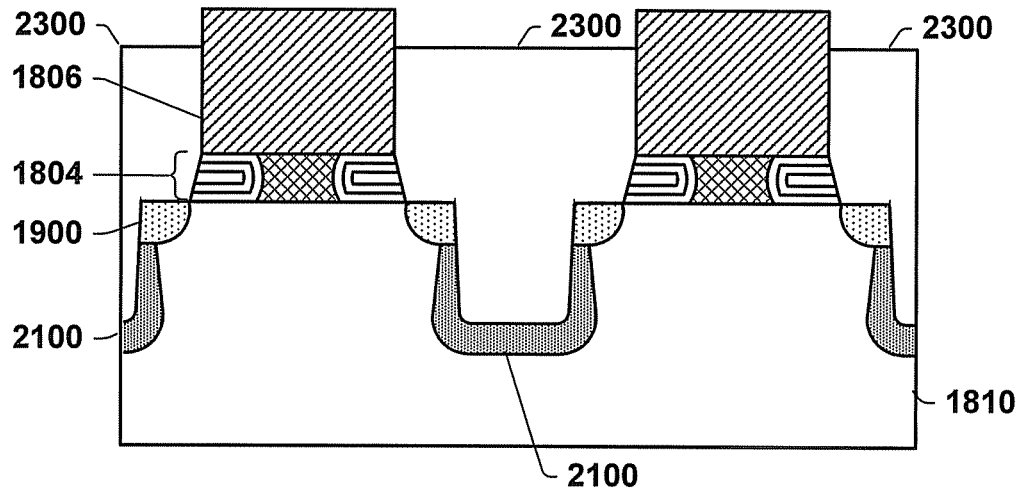
FIG. 23 illustrates removing an upper portion of a bit line dielectric layer in accordance with a fourth aspect of the subject invention.

FIG. 23 illustrates removing the first mask layer 1808 and removing an upper portion of the bit line dielectric layer 2200, thereby forming a bit line dielectric 2300 in the bit line opening 2002. The first mask layer 1808 and the upper portion of the bit line dielectric layer 2200 can be removed by any suitable technique. For example, the patterned first mask 1808 and the upper portion of the bit line dielectric layer 2200 are removed in the same manner as described for removal of the first mask layer 510 and the upper portion of the bit line dielectric layer 1000 in connection with FIG. 11.

Figure 24:
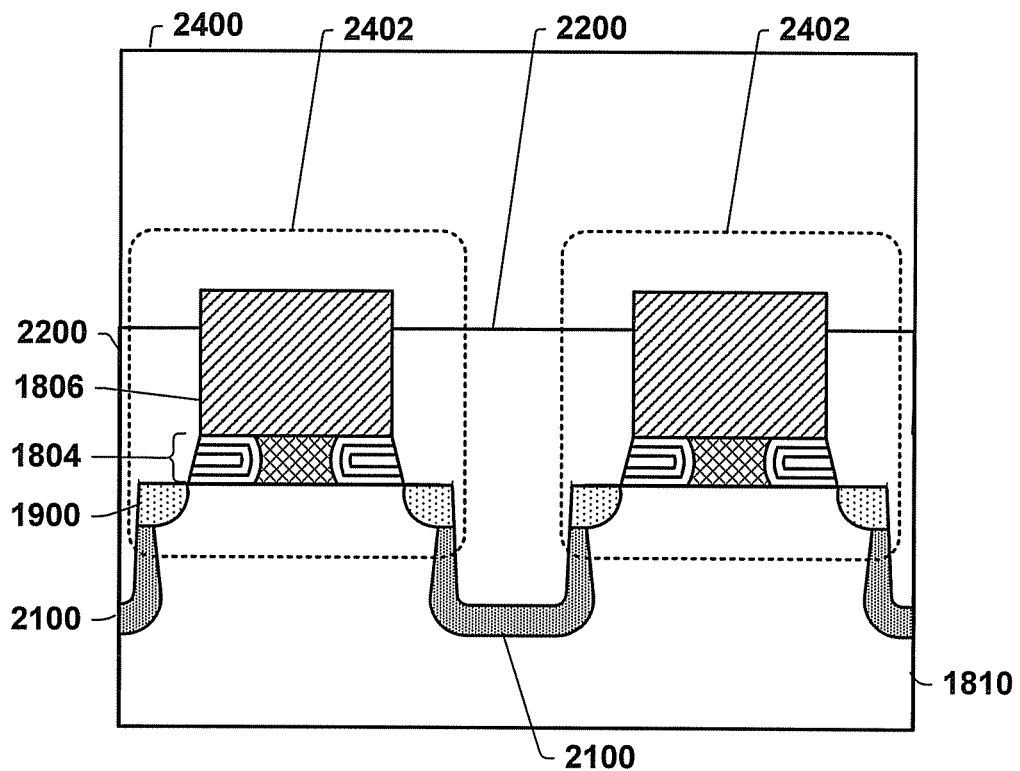
FIG. 24 illustrates forming a word line over a semiconductor substrate, thereby forming a memory cell on a semiconductor substrate in accordance with a fourth aspect of the subject invention.

FIG. 24 illustrates forming a word line 2400 over the semiconductor substrate 1810, thereby forming a memory cell 2402 on the semiconductor substrate 1810. The resultant memory device 1800 contains the charge storage nodes 1804 on the semiconductor substrate 1810 and the first poly gate 1806 on the charge storage nodes 1804. The charge storage nodes 1804 may or may not be separated from each other by a central dielectric 1816. The memory cells 2402 are separated from each other by the bit line dielectric 2300 in the bit line opening 2002. The memory cell 2402 further contains two pocket implant regions 1900 adjacent the charge storage node 1804 in the semiconductor substrate 1810 and the first bit line 2100 under the bit line opening 2002 in the semiconductor substrate 1810. The upper surfaces of the bit line dielectric 2300 are lower than the upper surface of the first poly gate 1806.

Figure 25:
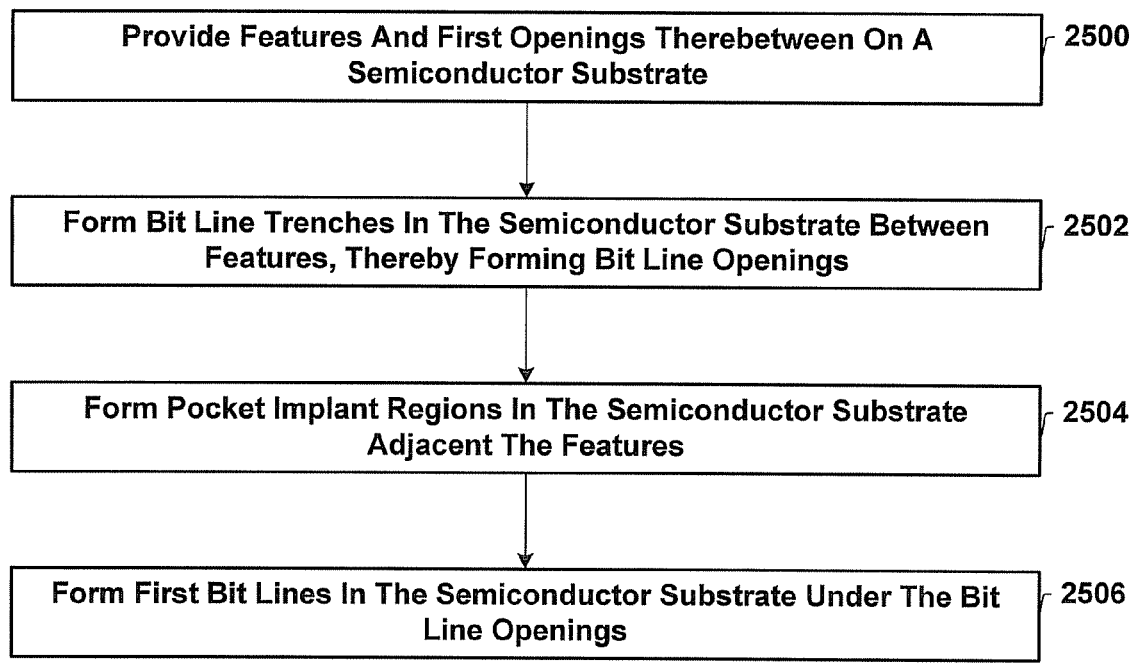
FIG. 25 illustrates an exemplary methodology of forming a memory cell having improved TPD characteristics in accordance with an aspect of the subject invention.

FIG. 25 illustrates an exemplary methodology of forming a memory cell having improved TPD characteristics. At 2500, features and first openings therebetween are provided on a semiconductor substrate. At 2502, bit line trenches are formed in the semiconductor substrate between features, thereby forming bit line openings. At 2504, pocket implant regions are formed in the semiconductor substrate adjacent the features. At 2506, first bit lines are formed in the semiconductor substrate under the bit line openings.

Although not shown in FIG. 25, the method can further include forming spacers adjacent the side surfaces of the features and the bit line trenches. In another embodiment, the method includes forming a second bit line under the bit line opening in the semiconductor substrate through the bit line opening after forming spacers adjacent the side surfaces of the features and the bit line trenches. In yet another embodiment, the method includes forming a word line over the semiconductor substrate. In still yet another embodiment, bit line trenches are formed after forming pocket implant regions.

Further, although not shown, the methodology of FIG. 25 may include any suitable memory device fabrication processes. General examples of memory device fabrication processes include masking, patterning, etching, planarization, thermal oxidation, implant, annealing, thermal treatment, and deposition techniques normally used for making memory devices.

The resultant memory cell formed herein can be employed for central processing units (CPUs); volatile memory devices such as DRAM devices, SRAM devices, and the like; input/output devices (I/O chips); and non-volatile memory devices such as EEPROMs, EPROMs, PROMs, and the like.

The resultant memory cell formed herein is useful in any electronic device such as a memory device. For example, the resultant memory cell is useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

What is claimed is:

1. A memory device structure comprising: two memory cell structures on a semiconductor substrate, each of the structures comprising two undercut openings separated by a dielectric, said openings being disposed under a monolithic first poly gate wherein said monolithic first poly gate defines the upper surface of each of said undercut openings, a charge storage node positioned within each undercut opening, wherein the charge storage node comprises one of an oxide/nitride/oxide tri-layer, an oxide/nitride bi-layer, a nitride/oxide bi-layer, an oxide/tantalum oxide bi-layer (Si02/Ta205), an oxide/tantalum oxide/oxide tri-layer (Si02FFa205/Si02), an oxide/strontium titanate bi-layer (Si02/SrTi03), an oxide/barium strontium titanate bi-layer (Si02/BaSrTi02), an oxide/strontium titanate/oxide tri-layer (Si02/SrTi03/Si02), an oxide/strontium titanate/barium strontium titanate tri-layer (Si02/SrTi03/BaSrTi02) and an oxide-nitride-polysilicon-nitride-oxide (ORPRO);
  a bit line opening, comprising a bit line trench, disposed between the two structures wherein the trench extends into the semiconductor substrate;
  spacers along the bit line openings, the spacers extending into the semiconductor substrate;
  the bit line openings comprising p-type pocket implant regions disposed therein, the pocket implant regions adjacent and below said charge storage nodes wherein an upper boundary of each pocket implant region is congruent with a lower boundary of the adjacent charge storage node and a first n-type bit line implant region, having a first width, disposed within the bit line opening adjacent to and extending below said pocket implant regions.

2. The memory device structure of claim 1, wherein the bit line line trench extends into the semiconductor substrate by 10 nm or more and 100 nm or less.

3. The memory device structure of claim 1, further comprising:
  spacers formed adjacent side surfaces of the structures and extending into the semiconductor substrate; and
  a second bit line comprising a second bit line implant region having a second width and extending below the first bit line implant region, the second width being narrower than the first width.

4. The memory device structure of claim 1, wherein the charge storage nodes comprise an oxide-nitride-polysilicon-nitride-oxide (ORPRO) configuration.

5. The memory device structure of claim 1, wherein each of the charge storage nodes has a sloping side surface that extends perpendicular to a topological surface of the semiconductor, said sloping side surface further defines at least a portion of the bit line opening and overlies at least a portion of a p-type pocket implant region.

6. An intermediate memory device structure comprising: two intermediate memory cell structures positioned on a semiconductor substrate, the two structures each comprising two undercut openings separated by a dielectric under a monolithic first poly gate, said monolithic first poly gate defining an upper surface of said undercut openings, a charge storage node positioned within each undercut opening, wherein each charge storage node comprises at least a first insulating layer, a charge storage layer, and a second insulating layer; and
  a bit line trench formed within a bit line opening, the trench extending into the semiconductor substrate, spacers along the bit line openings, the spacers extending into the semiconductor substrate, the bit line opening comprising a bit line dielectric between the structures, wherein the bit line trench comprises a p-type pocket implant, a first n-type bit line implant region and a second n-type bit line implant region extending below the first bit line implant region, the second bit line implant region having a narrower width than the first bit line implant region, wherein an upper boundary of each pocket implant region is congruent with a lower boundary of each adjacent charge storage node.

7. The intermediate memory device structure of claim 6, wherein the bit line trench extends into the semiconductor substrate by 10 nm or more and 100 nm or less.

8. The intermediate memory device structure of claim 6, wherein the charge storage nodes comprise a nitride layer sandwiched between two oxide layers.

9. The intermediate memory device structure of claim 6, wherein the charge storage nodes comprise silicon rich silicon nitride.

10. The intermediate memory device structure of claim 6, further comprising spacers adjacent side surfaces of the memory cells, including the charge storage nodes, and the bit line openings, the spacers extending into the semiconductor substrate.

11. The intermediate memory device structure of claim 6, wherein each of the charge storage nodes has a sloping side surface that extends perpendicular to a topological surface of the semiconductor, said sloping side surface further defines at least a portion of the bit line opening and overlies at least a portion of a p-type pocket implant region.

12. A structure comprising: two intermediate device structures on a semiconductor substrate, each of the two intermediate structures comprising two undercut openings separated by a dielectric under a monolithic first poly gate, said monolithic first poly gate defining the upper surface of said undercut openings;
  a charge storage node positioned within each undercut opening, the charge storage node comprising two layers, three layers or five layers wherein at least one of such layers is a charge storage layer;
  a bit line opening comprising spacers along the bit line opening, the spacers extending into the semiconductor substrate, a pocket implant region principally disposed under each of the charge storage nodes, wherein an upper boundary of each pocket implant region is congruent with a lower boundary of the adjacent charge storage node, a first bit line implant region extending into the semiconductor substrate and a second bit line implant region extending below the first bit line implant region, the second bit line implant region having a narrower width than the first bit line implant region; and the bit line opening further comprising a bit line dielectric between the two intermediate structures, the bit line opening and the bit line dielectric extending into the semiconductor substrate.

13. The device structure of claim 12, wherein the bit line opening and the bit line dielectric extend into the semiconductor substrate by 10 nm or more and 100 nm or less.

14. The device structure of claim 12, wherein at least one of the two layers, the three layers or the five layers of the charge storage nodes comprises silicon rich silicon nitride.

* * * * *